(12) United States Patent
Nakashima et al.

(10) Patent No.: US 6,884,569 B2
(45) Date of Patent: Apr. 26, 2005

(54) METHOD OF MANUFACTURING TFT ARRAY

(75) Inventors: Ken Nakashima, Kumamoto (JP); Kazuhiro Kobayashi, Kumamoto (JP)

(73) Assignee: Advanced Display, Inc., Nishigoshi-machi (JP)

( * ) Notice: Subject to any disclaimer, the term of this patent is extended or adjusted under 35 U.S.C. 154(b) by 299 days.

(21) Appl. No.: 10/132,579

(22) Filed: Apr. 3, 2002

(65) Prior Publication Data

US 2003/0190556 A1 Oct. 9, 2003

Related U.S. Application Data

(63) Continuation of application No. PCT/JP01/06286, filed on Jul. 19, 2001.

(30) Foreign Application Priority Data

Aug. 9, 2000 (JP) .......................................... 2000-241264

(51) Int. Cl.[7] ................................................ G03F 7/20
(52) U.S. Cl. ......................... 430/316; 430/313; 430/396
(58) Field of Search ................................ 430/5, 311, 313, 430/316, 396, 394

(56) References Cited

U.S. PATENT DOCUMENTS

| 5,851,702 A | 12/1998 | Watanabe | 430/5 |
| 5,879,844 A | 3/1999 | Yamamoto | 430/30 |
| 6,069,019 A * | 5/2000 | Ishii et al. | 438/30 |

FOREIGN PATENT DOCUMENTS

| JP | 10-163 174 A | 6/1998 |
| JP | 2000-066240 A | 3/2000 |

* cited by examiner

Primary Examiner—Kathleen Duda

(57) ABSTRACT

In the halftone region of a photomask, uniformity in thickness of the photoresist is enhanced. The halftone region of the photomask is arranged such that a transmitting portion and a shielding portion are alternately provided to form a transmitting/shielding pattern. The transmitting portion at the end of the transmitting/shielding pattern has a larger area than the other transmitting portion.

21 Claims, 20 Drawing Sheets

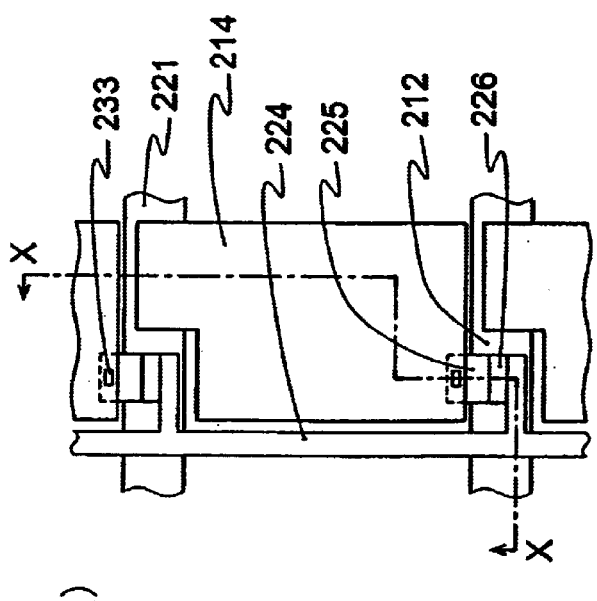
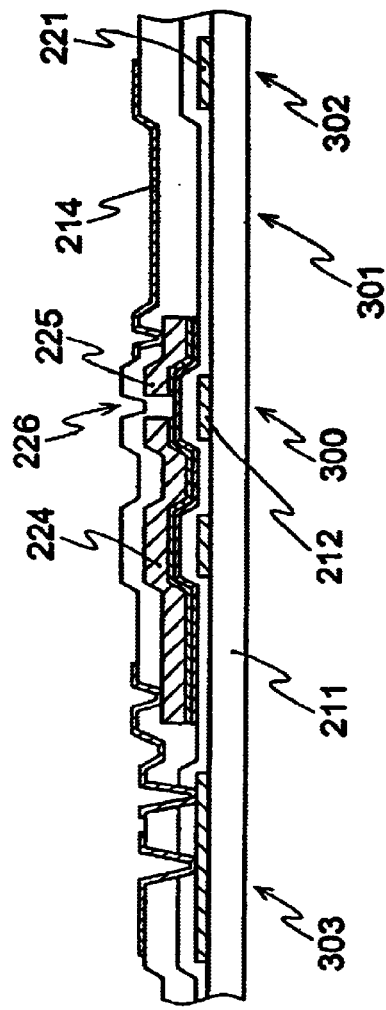
FIG. 2(a) (PRIOR ART)
FIG. 2(b) (PRIOR ART)

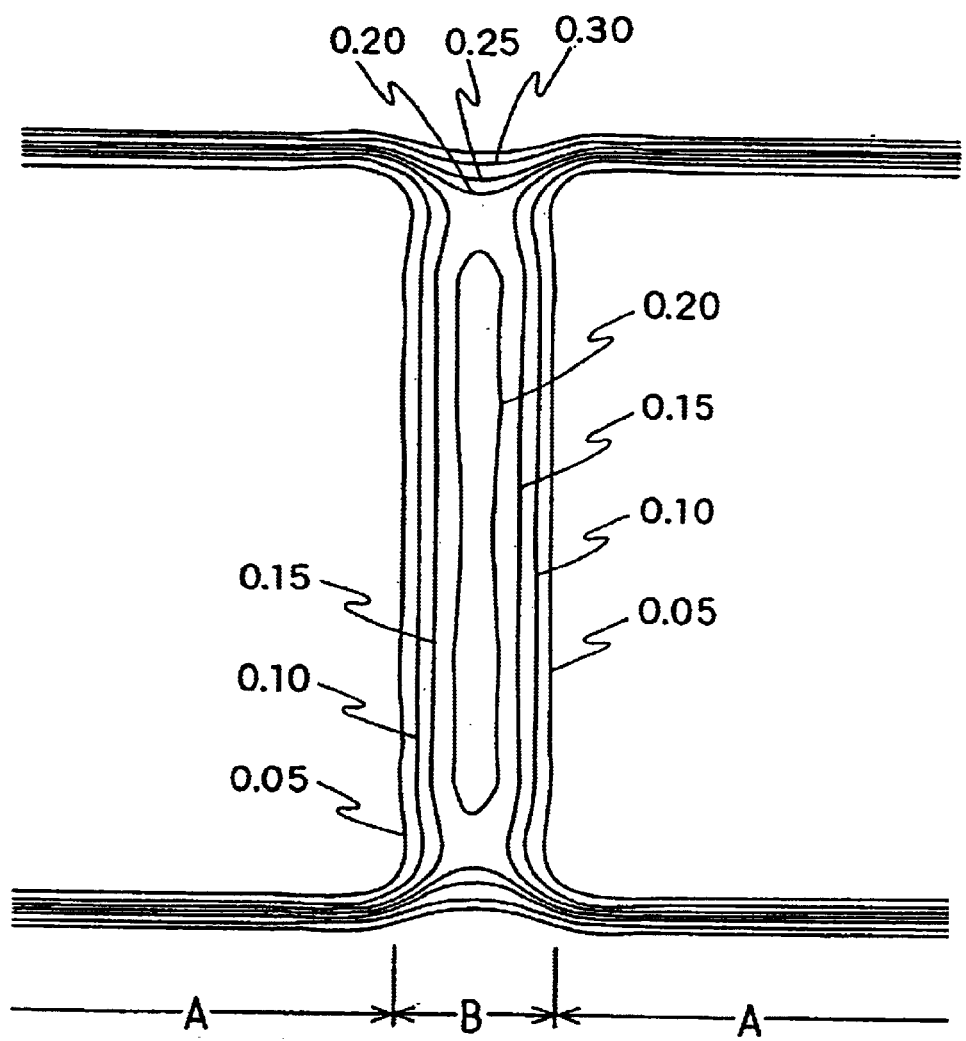

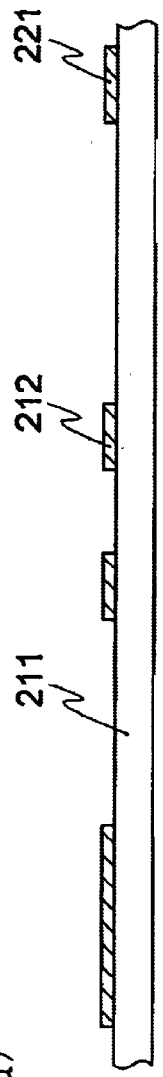
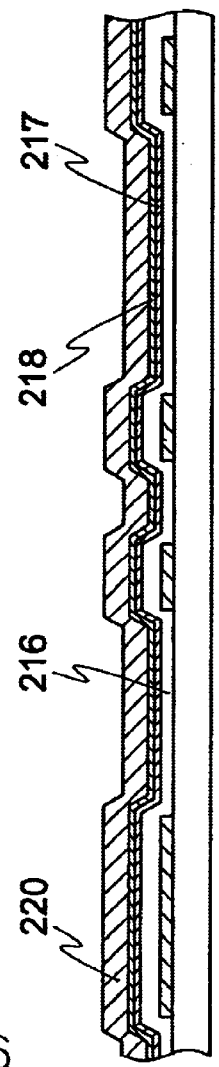
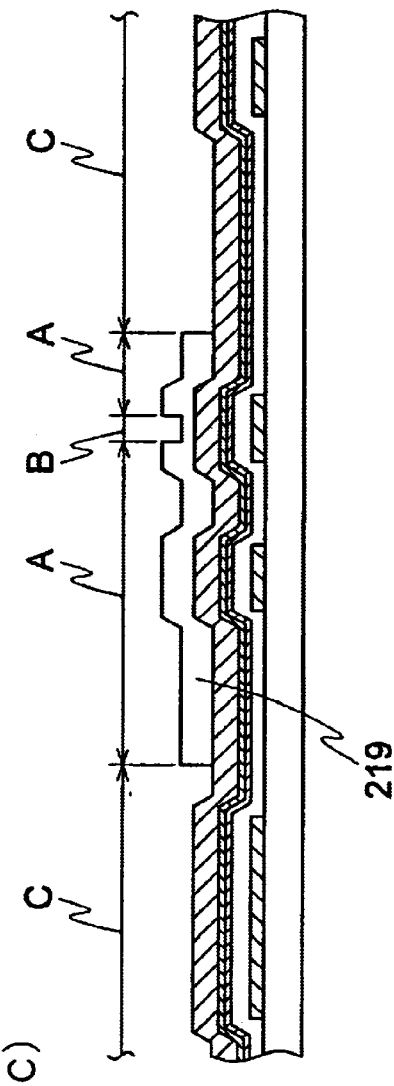
FIG. 10(a)
FIG. 10(b)
FIG. 10(c)

METHOD OF MANUFACTURING TFT ARRAY

CROSS REFERENCE TO RELATED APPLICATIONS

This application is a continuation of PCT application no. PCT/JP01/06286, filed Jul. 19, 2001.

TECHNICAL FIELD

The present invention relates to a method of manufacturing a TFT array of a liquid crystal display, and more particularly to a photomask to be used for exposing a photoresist to form a photoresist pattern.

BACKGROUND ART

In a liquid crystal display, an electric field is applied to a liquid crystal held between opposed substrates, for carrying out display. A liquid crystal display has a lighter weight, smaller power consumption and greater portability than those of a CRT. In particular, an active matrix liquid crystal display (AMLCD), in which a switching element such as a thin film transistor (TFT) is provided on a substrate to control an electric field to be applied to a liquid crystal, is very excellent in quality of display and has recently been applied to wide uses.

Referring to FIGS. 1 and 2, the active matrix liquid crystal display (AMLCD) will be described. FIG. 1 shows an example of circuit configuration in the AMLCD, which is referred to as a so-called "Cs on Gate" AMLCD. The reference numeral 101 denotes a gate line for supplying a scanning signal, the reference numeral 102 denotes a source line for supplying a voltage signal, the reference numeral 103 denotes a thin film transistor (TFT) which is a switching element for applying a voltage to a liquid crystal, the reference numeral 104 denotes a liquid crystal for switching transmission/non-transmission of light which is represented as a capacitance on an equivalent circuit, the reference numeral 105 denotes a storage capacitance provided electrically in parallel with the liquid crystal 104 and serving to reduce the influence of a parasitic capacitance of a TFT, the reference numeral 106 denotes a connecting portion for connecting an electrode on either side of the liquid crystal 104 to a common voltage, the reference numeral 107 denotes a gate terminal for connecting an external circuit on the gate side to the gate line 101 through a TCP or the like, the reference numeral 108 denotes a source terminal for connecting an external circuit on the source side to the source line 102 through the TCP or the like, the reference numeral 111 denotes a line connected to the gate lines 101, the reference numeral 112 denotes a line connected to the source lines 102, and the reference numeral 113 denotes a connection for connecting the line 111 to the line 112. The reference numeral 114 denotes a repair line to be used when the source line is open. Although not shown in FIG. 1, a component which may be a TFT or an element of high resistance having linear or non linear characteristics may be provided between the gate terminal 107 and line 111 and between the source terminal 108 and line 112 to electrically isolate the gate terminal 107 and source terminal 108 during signal application and to electrically connect the gate terminal 107 and source terminal 108 when static electricity of high voltage invades. In many cases, a TFT array is formed with such a configuration as shown in FIG. 1 as described above. After combined with a counter substrate on which a color filter is provided, a liquid crystal is injected therebetween and the outside of a region 115 shown in a dotted line in the drawing is generally cut out to form a liquid crystal display.

While the repair line 114, for example, formed of the same material of the gate line to be a substitute of the source line is shown in FIG. 1, it does not need to be formed depending on circumstances.

FIG. 2(a) is a partially enlarged plan view showing the TFT array of the AMLCD in FIG. 1 and FIG. 2(b) is a sectional view taken along the line X—X in FIG. 2(a). Since a terminal portion 303 is provided on the outside of the region of FIG. 2(a), it is shown in only FIG. 2(b).

In FIG. 2, the reference numeral 211 denotes an insulative substrate, the reference numeral 212 denotes a gate line formed of a conductive film, the reference numeral 221 denotes a storage capacitance electrode, the reference numeral 224 denotes a source line, the reference numeral 225 denotes a drain electrode, and the reference numeral 214 denotes a pixel electrode formed of a transparent conductive layer. In the Cs on Gate AMLCD, the gate line 212 also serves as the storage capacitance electrode 221 and the storage capacitance 105 is formed between the gate line 212 and the pixel electrode 214.

A process for manufacturing the TFT array in FIG. 2 will be described with reference to FIGS. 3, 4 and 5.

First of all, a first conductive film is formed on the first insulative substrate 211. The first conductive film is formed of metal such as Cr, Al, Ti, Ta, Au, Ag, W, Mo, Mo—W or Cu, an alloy including either of or some of these metals as essential components, or a laminated layer of these metals and/or alloys, by a method such as sputtering, evaporation, CVD or printing. Subsequently, the gate line 212 and the storage capacitance electrode 221 are formed by photolithography and succeeding etching (FIG. 3(a)).

Then, an insulating film 216 comprising $Si_3N_4$ is formed by a plasma CVD method, another suitable CVD method, sputtering, evaporation, coating or the like, and furthermore, an a–Si:H film 217 (a hydroxide amorphous silicon film) and an n+Si:H film 218 doped with an impurity such as phosphorus are continuously formed by a plasma CVD method, another suitable CVD method or sputtering.

Next, a second conductor layer 220 is formed of metal such as Cr, Al, Ti, Ta, Au, Ag, W, Mo, Mo—W or Cu, an alloy including either of or some of these metals as essential components or a laminated layer of these metals and/or alloys (FIG. 3(b)).

Subsequently, the whole surface is first coated with a photosensitive organic resin which can be used as a photoresist. Then, a photoresist pattern 219 is formed by exposure using a photomask (FIG. 3(c)). The shape of the photoresist pattern 219 will be described in detail.

First of all, at least a part of a portion to be a pixel electrode later is set to be a region (region C) in which the photoresist is not formed. Moreover, at least a portion to be a source electrode and a drain electrode later are set to be a region (region A) in which the photoresist has a great thickness. Moreover, a portion in which the second conductor layer 220 and the n+Si:H film 218 are removed by etching to leave the a–Si:H film 217, for example, a channel portion 226 of the TFT is set to be a region (region B) in which the photoresist has a small thickness.

Subsequently, the etching is carried out by using the photoresist pattern 219. First of all, the second conductor layer 220 is etched by wet or dry etching or the like. Then, the n+Si:H film 218 and the a–Si:H film 217 are etched. The conductor layer 220, the n+Si:H film 218 and the a–Si:H film 217 in the region C are removed (FIG. 4(a)).

Thereafter, ashing is carried out by using plasma capable of reducing the thickness of the photoresist, for example, an oxygen plasma, thereby scraping the photoresist to be removed from the region B (FIG. 4(b)). At this time, the thickness of the photoresist in the region A becomes smaller than an initial thickness, but the ashing is controlled to maintain such a thickness as to fully protect a portion which is not etched during etching at a subsequent step.

Subsequently, the second conductor layer 220 exposed by removing the photoresist in the region B is removed by wet or dry etching or the like.

Then, at least the n+Si:H film 218 in the region B is removed by the dry etching or the like and the photoresist is finally peeled to form a predetermined pattern (FIG. 4(c)).

Thereafter, a protective film 222 is formed by an insulating film comprising $Si_3N_4$ or $SiO_2$, or their mixture and lamination. A photoresist pattern is provided by photolithography for forming a contact hole 233 in a gate terminal portion, a source terminal portion and a drain electrode portion, and subsequently, the contact hole 233 is formed by dry etching or wet etching using a $CF_4$ based gas. After the etching is completed, the photoresist is removed (FIG. 5(a)).

Next, a transparent conductive layer comprising a transparent conductive film such as ITO, $SnO_2$ or InZnO, a laminated layer thereof or a layer of mixture thereof is formed on the protective film 222 by a method such as sputtering, evaporation, coating, CVD, printing or a sol-gel method, and desirable patterns of the pixel electrode 214, an upper pad 215 and the like are formed by photolithography and succeeding wet or dry etching or the like, so that a TFT array is formed (FIG. 5(b)).

Furthermore, an orientation film is formed on the TFT array and is opposed to a counter substrate having at least an orientation film and a common electrode on its surface, and a liquid crystal is injected therebetween to form an active matrix liquid crystal display, although not shown in the figures. Through the above-mentioned steps, the TFT array and a liquid crystal display using the TFT array are formed.

In order to form the photoresist pattern 219 having the region A in which the photoresist has a great thickness, the region B in which the photoresist has a small thickness and the region C in which the photoresist is removed (the thickness is substantially zero) as shown in FIG. 3(c), a so-called halftone mask is used as a photomask.

The halftone mask is a photomask capable of carrying out intermediate exposure in addition to a binary process in which light illuminated from an exposing machine is transmitted or interrupted depending on the presence of a shielding film. The intermediate exposure can be obtained by alternately arranging a transmitting portion through which illuminated light is transmitted and a shielding portion through which illuminated light is not transmitted to thereby constitute a transmitting/shielding pattern and by sufficiently increasing the spatial frequency of the transmitting/shielding pattern than the pattern resolution of the exposing machine. Consequently, the transmitting/shielding pattern cannot be accurately exposed with the pattern resolution of the exposing machine, and the whole region of the photoresist below the transmitting/shielding pattern is exposed in an intermediate amount of exposure.

An actual halftone mask pattern is illustrated in FIGS. 6 and 7. A mask pattern SH1 in FIG. 6 has a region A1 for shielding the illuminated light of the exposing machine and a halftone region B1 corresponding to the region B of the photoresist pattern 219, and the halftone region B1 is defined by transmitting/shielding pattern having a plurality of fine rectangular transmitting portions. The fine transmitting/shielding pattern cannot be drawn with the pattern resolution of the exposing machine. For this reason, the whole halftone region B1 is exposed weakly.

A mask pattern SH2 in FIG. 7 has a region A2 for shielding the illuminated light of the exposing machine and a halftone region B2 corresponding to the region B of the photoresist pattern 219, and the halftone region B2 is defined by a stripe-shaped transmitting/shielding pattern. As a matter of course, the fine transmitting/shielding pattern cannot be drawn with the pattern resolution of the exposing machine. For this reason, the whole halftone region B2 is exposed weakly.

A photoresist pattern formed by using the halftone mask shown in FIG. 6 or 7 has such a thickness as shown in an explanatory view of FIG. 8. FIG. 8 shows the thickness of the photoresist in a shade of color, and a dark portion represents a region in which the photoresist has a great thickness and a light portion represents a region in which the photoresist has a small thickness. Moreover, FIG. 9 shows the result obtained by carrying out a simulation using LILE (TRADE NAME; manufactured by Seiko Instruments) for the amount of exposure in the TFT array surface in the case in which the exposure is performed by using the halftone mask in FIG. 6 or FIG. 7. The result indicates a relative value, wherein the amount of exposure without the halftone mask is set to 1. Moreover, the conditions of the simulation are as follows.

Simulation Condition:
Exposure wavelength=0.436 $\mu$m (g ray)
Numerical aperture (NA) of projection lens of stepper= 0.1
Illumination system coherency ($\sigma$)=0.5

As is apparent from FIGS. 8 and 9, the thickness of the photoresist in the region B (halftone regions B1 or B2) is smaller than that of the photoresist in the region A. However, the thickness of the photoresist in the region B has a variation to show a poor uniformity.

Accordingly, the photoresist in the region B is partially dissipated due to a fluctuation in the amount of exposure during exposure. To the contrary, the thickness of the photoresist in the region B is left too thickly so that a time required for removing the photoresist is increased at the time of ashing or the photoresist removing defect is partially caused. Consequently, yield is deteriorated or tact is increased.

Moreover, in the case in which a plurality of halftone masks are used for one substrate to carry out the exposure, the amount of the exposure in the region B are varied. As a matter of course, the photoresist is partially dissipated, the time required for removing the photoresist is increased and the photoresist removing defect is partially caused. Consequently, the yield is deteriorated and the tact is increased.

For these reasons, the manufacturing cost of the TFT array is necessarily increased. Moreover, the defect of the shape of the TFT is caused by the nonuniformity of the thickness of the photoresist. In particular, a variation in the length of a TFT channel portion is increased so that a display characteristic is deteriorated.

The present invention has been made in consideration of the above-mentioned problems in the prior arts, and has an object to enhance the uniformity of the thickness of a photoresist in a halftone region and to implement high yield and low tact, and to suppress a variation in the channel length of a TFT to obtain display of high quality when forming the photoresist pattern by using a halftone mask.

DISCLOSURE OF INVENTION

In order to solve the above-mentioned problems, in the present invention, precision in the dimension of a photomask in a halftone region is set to 0.1 µm or less, desirably 0.05 µm or less, thereby enhancing the uniformity of the thickness of a film.

Moreover, the shape of the photomask on both ends of the halftone region is modified to increase the amount of exposure on both ends.

Furthermore, in the case in which a plurality of halftone masks are used for one substrate to carry out the exposure, a variation in a dimension between the photomasks is set to ±0.1 µm or less, desirably 0.05 µm or less, thereby causing the film thickness of the photoresist to be equal between the halftone regions. dr

BRIEF DESCRIPTION OF DRAWINGS

FIG. 2 shows a TFT array of the active matrix liquid crystal display in FIG. 1, FIG. 2(a) being a partially enlarged plan view and FIG. 2(b) being a view showing an X—X section in FIG. 2(a);

FIG. 9 is a view representing a result obtained by a simulation for the amount of exposure in a TFT array surface;

FIG. 10 is a view illustrating a process for manufacturing a TFT array according to the present invention;

BEST MODE FOR CARRYING OUT THE INVENTION

An embodiment of the present invention will be described below with reference to the drawings.

Embodiment 1

Figure 11A:
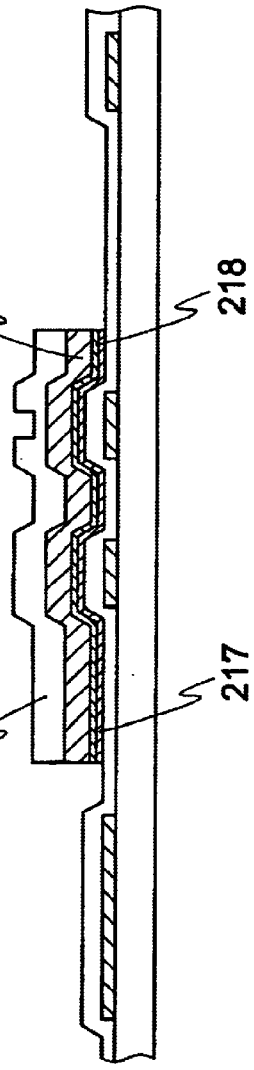
FIG. 11 is a view showing the process for manufacturing the TFT array according to the present invention, illustrating a succeeding step to FIG. 10.
Figure 11B:
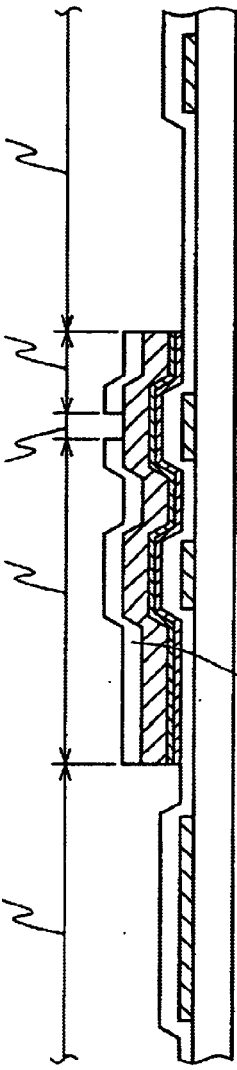

The embodiment of the present invention will be described in detail with reference to FIGS. 10, 11 and 12.

First of all, a first conductive film is formed on a first insulating substrate 211. The first conductive film is formed of metal such as Cr, Al, Ti, Ta, Au, Ag, W, Mo, Mo—W or Cu, an alloy containing either of or some of these metals as essential components, or a laminated layer of these metals and/or alloys, by a method such as sputtering, evaporation, CVD or printing. Subsequently, a gate line 212, a storage capacitance electrode 221 and the like are formed by photolithography and succeeding etching and the like (FIG. 10(a)).

Then, an insulating film 216 comprising $Si_3N_4$, a substance which is slightly deviated from a stoichiometric composition or a composition thereof is formed by a plasma CVD method, another suitable CVD method, sputtering, evaporation, coating or the like. Furthermore, an a–Si:H film (a hydroxide amorphous silicon film) 217 to be used as a semiconductor layer for a channel which is not doped with an impurity or is intentionally doped with the impurity with an impurity concentration of approximately 50 ppm or less, or a dopant concentration such that a dark current does not exceed 50 pA on actual use voltage conditions. Succeedingly, a semiconductor layer doped with an impurity in a high concentration which contains an impurity such as phosphorus, antimony or boron in a film in an atom ratio of 0.05% or more, for example, in order to obtain a contact with metal, for example, an n+Si:H film or a macrocrystal n+Si layer are formed by various CVD methods such as a plasma CVD method or sputtering (an n+Si:H film 218 is illustrated in the drawing)

Next, a second conductive film 220 is formed of metal such as Cr, Al, Ti, Ta, Au, Ag, W, Mo, Mo—W or Cu, an alloy containing either of or some of these metals as essential components or a laminated layer of these metals and/or alloys (FIG. 10(b)).

Subsequently, the whole surface is first coated with a photoresist. Then, a photoresist pattern 219 is formed by exposure using a photomask (FIG. 10(c)). The photoresist pattern 219 has the following configuration.

First of all, a portion in which the conductive layer 220, the n+Si:H film 218 and the a–Si:H film 217 should be removed, for example, at least a part of a portion to be a pixel electrode later is set to be a region in which the photoresist is not formed (region C). Moreover, at least a portion to be a source electrode and a drain electrode later is set to be a region in which the photoresist has a great thickness (region A). Furthermore, a portion in which the second conductive layer 220 and the n+Si:H film 218 are removed by etching and the a–Si:H film 217 are to be left later, for example, a TFT channel portion 226 is set to be a region in which the photoresist has a small thickness (region B).

It is desirable that at least a part of a portion on the gate line 212 between adjacent source lines should be set to be the region C, so that the a–Si:H film 217 should be removed in addition to the conductive layer 220 and the n+Si:H film 218, thereby electrically isolates adjacent source lines (i.e. semiconductor layers between adjacent source lines are not continuously provided).

In order to form a photoresist pattern having a thickness varied depending on a place, a halftone mask is used. The halftone mask will be described below. While a positive photoresist is used in the present embodiment, a photoresist pattern can be basically formed by the same method with a negative photoresist.

First of all, a portion in which the region C having no photoresist is to be formed is set such that the photomask is brought into an almost transparent, so that light is transmitted sufficiently and the photoresist is exposed with a sufficient amount of light so as not to cause the photoresist to remain at time of development. As a result, the photoresist is completely removed at time of the development so that the region C having no photoresist is formed.

On the other hand, in a portion in which the region A including the photoresist having a great thickness, a layer formed of such a material as not to transmit light, for example, Cr is provided in a sufficient thickness on the photomask such that the exposing light is not transmitted. As a result, illuminated light does not sufficiently expose the photoresist in this portion at time of exposure. Therefore, it is possible to implement the region A in which the photoresist remains in a sufficient thickness at time of the development.

In a portion in which the region B including the photoresist having a small thickness is to be formed, a transmitting portion through which the exposing light is transmitted and a shielding portion through which the exposing light is not transmitted are alternately provided on the photomask, thereby defining a transmitting/shielding pattern. By increasing the spatial frequency of the transmitting/shielding pattern to be much higher than the pattern resolution of an exposing machine, an intermediate exposure amount between those of region A and C can be obtained.

By providing the region through which the exposing light is transmitted, the region through which the exposing light is not transmitted, and the transmitting/shielding pattern on the photomask, it is possible to form a photoresist pattern including three regions of the region C, the region A and the region B which have different thicknesses. The amount of exposure or the amount of light is represented by multiplying light intensity by time.

By regulating the amount of exposure through the photomask as described above, it is possible to realize the thickness of the photoresist having a relationship of region A>region B>region C (=substantially 0) at time of the development.

As described with reference to FIGS. 8 and 9, however, in the case in which the region A, the region B and the region C are formed by using a conventional halftone mask, the thickness of the photoresist in the region B has a poor uniformity. Furthermore, the photoresist in the region B is partially dissipated due to a fluctuation in the amount of exposure at time of the exposure. On the contrary, the photoresist is left thickly so that a time required for removing the photoresist is increased at time of ashing or photoresist removing defects are partially caused.

In addition, in the case in which the exposure is to be carried out by using a plurality of halftone masks for one substrate, the amount of the exposure in the region B are varied so that the photoresist is partially dissipated, the time required for removing the photoresist is increased and the photoresist removing defects are partially caused.

One of the causes of the nonuniformity in the thickness of the photoresist includes dimensional precision in the transmitting/shielding pattern.

Figure 6:
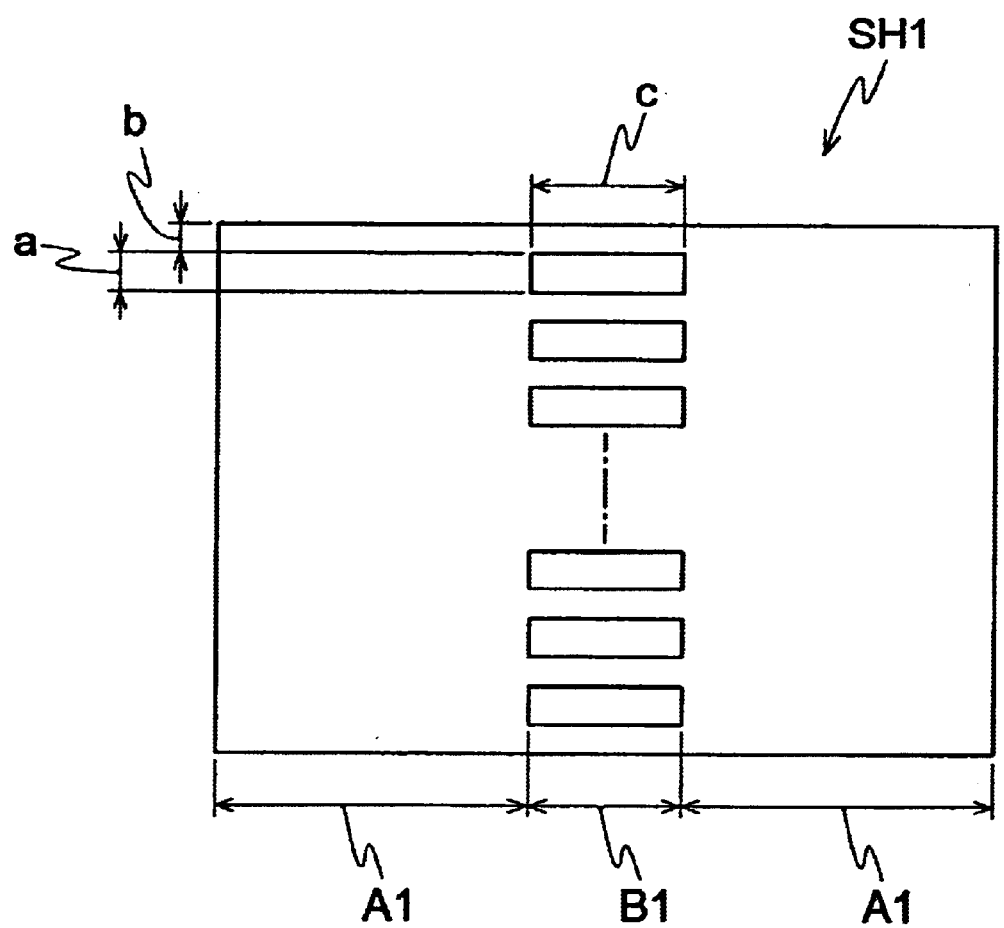
FIG. 6 is a diagram showing an example of a halftone mask pattern.
Figure 13:
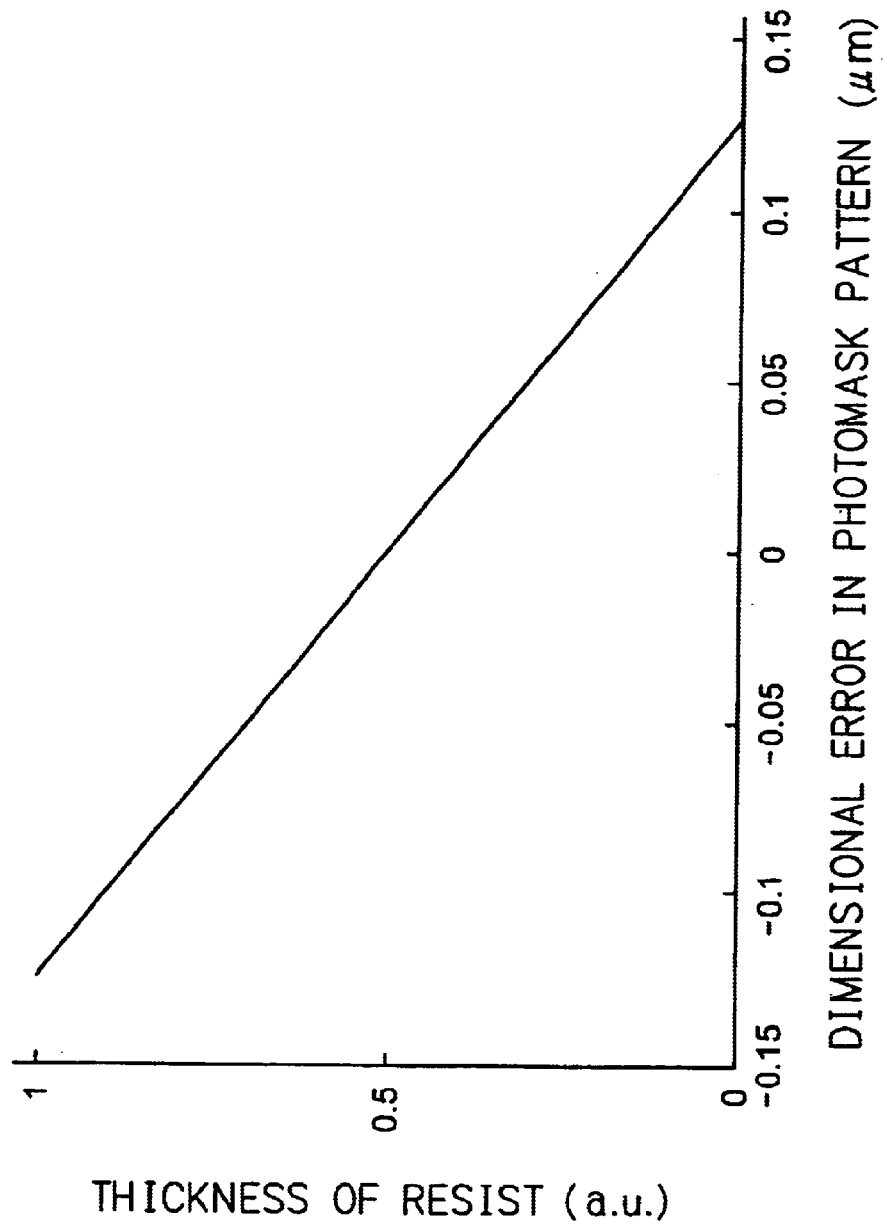
FIG. 13 is a chart showing the relationship between the dimensional error of a transmitting/shielding pattern and the film thickness of a photoresist.

In a conventional photomask SH1 shown in FIG. 6, the transmitting/shielding pattern is defined by a rectangular transmitting portion having a length a and a width c and a shielding portion having a length b and a width e which are alternately provided. FIG. 13 shows the thickness of the photoresist in the central part of the region B in the case in which the dimension has an error in the transmitting/shielding pattern. In general, the dimensional error of the mask pattern is caused by overetching/underething when the mask is to be patterned. Therefore, in the case in which the dimension a has an error, it can be supposed that a dimension (a+b) is almost constant. In FIG. 13, accordingly, it is assumed that the dimension (a+b) is constant.

In the case in which the dimension a has no error as designed, the thickness of the photoresist in the region B is almost half (0.5) of the thickness of the region A. In the case in which the error of the dimension a is more than 0.1 $\mu$m, the thickness of the photoresist in the region B is 1.0, that is, is equal to that in the region A or the thickness of the photoresist is 0, that is, is equal to that in the region C.

The dimensional error of a conventional photomask for forming a general TFT array is more than ±0.1 $\mu$m. By the dimensional error of the transmitting/shielding pattern, therefore, the thickness of the photoresist in the region B is sometimes 1.0, that is, is equal to that in the region A or the thickness of the photoresist is sometimes 0, that is, is equal to that in the region C. For this reason, yield is deteriorated when forming the region B.

In the present embodiment, therefore, at least the dimensional error of the transmitting/shielding pattern of the photomask is set to be ±0.1 $\mu$m or less. Consequently, the photoresist in the region B can be prevented from being dissipated partially. On the contrary, the photoresist can be prevented from being left thickly to increase the time required for removing the photoresist at time of the ashing or the photoresist removing defects can be prevented from being generated partially. Thus, it is possible to enhance the yield and to shorten tact.

By setting the dimensional error of the transmitting/shielding pattern to be ±0.05 $\mu$m or less, furthermore, the uniformity of the thickness of the photoresist in the region B can be enhanced still more. Consequently, even in the case in which the amount of exposure at time of the exposure and the amount of resist removal in the region B at a subsequent step are varied, the partial dissipation and removing defects of the photoresist can be decreased and the yield can be enhanced considerably.

In the case in which a plurality of halftone masks are used for one substrate to carry out the exposure, furthermore, a plurality of photomasks are selected such that a variation in the dimension of the transmitting/shielding pattern of the photomask is 0.1 $\mu$m or less, and these masks are used to carry out the exposure. Consequently, it is possible to suppress a variation in the thickness in a plurality of regions B, and the photoresist in the region B can be prevented from being dissipated partially. To the contrary, the photoresist removing defects can be prevented from being generated partially. By selecting and using a plurality of photomasks such that a variation in the dimension in the transmitting/shielding pattern is equal to or less than ±0.05 $\mu$m, furthermore, it is possible to carry out the exposure with substantialy the same exposure conditions for a plurality of exposure regions in consideration of a variation in the amount of the exposure of the exposing machine.

The photoresist pattern 219 is formed by using such a photomask, and the second conductive layer 220 is first etched by wet or dry etching or the like, thereby forming a source line, a source electrode and a drain electrode. Subsequently, the n+Si:H film 218 and the a–Si:H film 217 are subjected to etching. The etching is carried out by a gas containing HCl as an essential component, a gas containing $CF_4$ as an essential component, a mixed gas of $CF_4$ and $O_2$, a gas containing $SF_6$ as an essential component or the like, for example. As a result, the n+Si:H film 218 and the a–Si:H film 217 are removed from a portion to be at least a part of a pixel electrode to transmit light therethrough. In a terminal portion 303 to be connected to a TCP or the like in order to input a signal from the outside to a gate line or a portion to be short-circuited with a source line directly or through a TFT or a resistor in order to prevent static electricity, moreover, the n+Si:H film 218 and the a–Si:H film 217 may be removed at this step (FIG. 11(a)).

Subsequently, the ashing is carried out by using a plasma capable of reducing the thickness of the photoresist, for example, an oxygen plasma, thereby scraping the photoresist to be removed from the region B (FIG. 11(b)). At this time, the thickness of the photoresist in the region A becomes smaller than an initial thickness but sufficient thickness is held such that a portion which is not etched at a succeeding etching step can be protected sufficiently. The photoresist in the region B may be scraped by the dry etching for removing the n+Si:H film 218 and the a–Si:H film 217.

At this time, the uniformity of the thickness of the photoresist in the region B exposed by the photomask pattern is excellent. Therefore, it is possible to reduce the residual photoresist, to enhance the yield of the photoresist removal and to shorten the photoresist removing tact. Moreover, the shape of the photoresist in the region A can be enhanced after the photoresist in the region B is removed and the second conductive layer 220 of the TFT channel portion 226 can be accurately removed. Accordingly, the channel length of the TFT can particularly be controlled easily and quality of display can be enhanced.

Moreover, in the case in which a TFT is to be formed in addition to a display portion for protection against the static electricity having a high voltage, a mask pattern for forming the region B of the TFT is made equivalent to those for forming the region B of the TFT in the display portion so that the thickness of the resist can be equal and the yield can be thereby enhanced.

Subsequently, a portion exposed by removing the photoresist in the region B, i.e. at least the second conductive layer 220 of the TFT channel portion 226, is etched by wet or dry etching or the like.

Figure 11C:
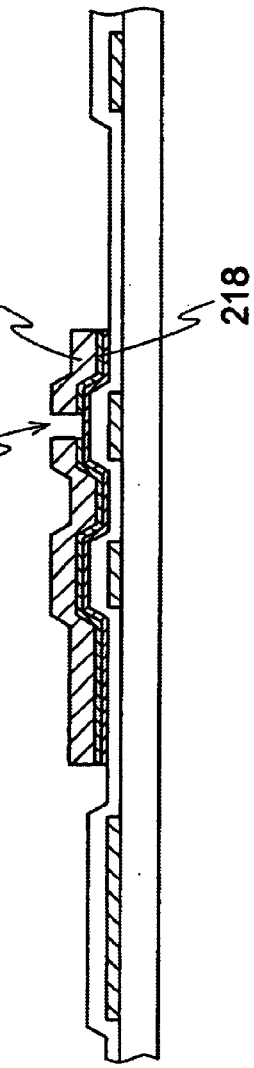
Figure 12:
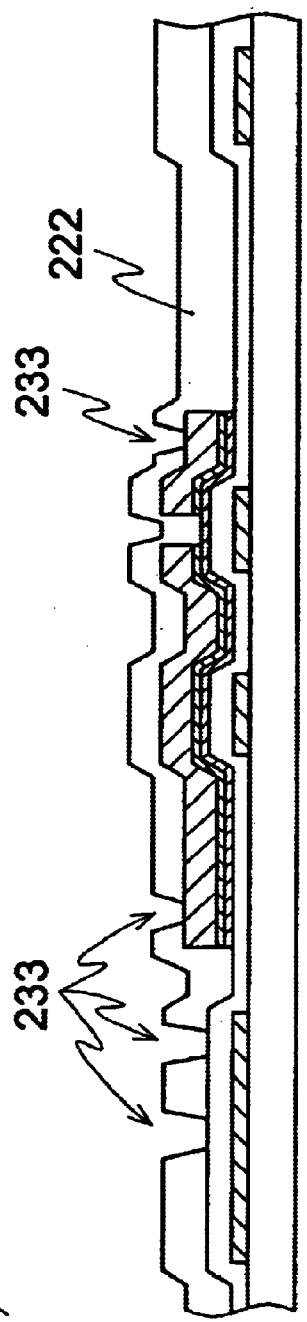
FIG. 12 is a view showing the process for manufacturing the TFT array according to the present invention, illustrating a succeeding step to FIG. 11.
Figure 12:
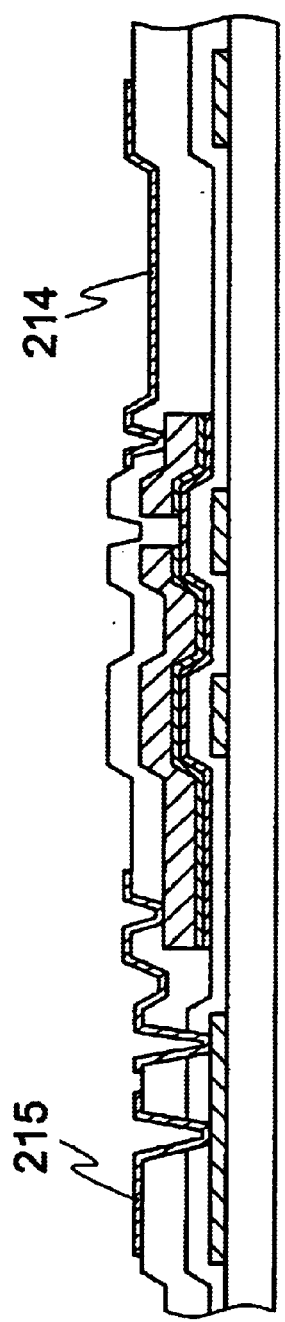

Then, at least the n+Si:H film 218 in the TFT channel portion 226 is removed by the dry etching or the like and the photoresist 219 is finally peeled so that a predetermined pattern is obtained (FIG. 11(c)).

Thereafter, a passivation film 222 is formed by an insulating film comprising $Si_3N_4$ or $SiO_2$, or their mixture and lamination. A photoresist pattern for forming a contact hole 233 is provided by photolithography in a gate terminal portion, a source terminal portion and a drain electrode portion, and subsequently, the contact hole 233 is formed by dry etching using a $CF_4$ based gas or wet etching. After the etching is completed, the photoresist is removed (FIG. 12(a)).

Next, a transparent conductive layer comprising a transparent conductive film such as ITO, $SnO_2$ or InZnO, a laminated layer thereof or a layer comprising a mixture thereof is formed on the passivation film 222 by a method such as sputtering, evaporation, coating, CVD, printing or a sol-gel method, and a predetermined pattern of the pixel electrode 214, an upper pad 215 and the like are formed by photolithography and succeeding wet or dry etching or the like so that a TFT array is formed (FIG. 12(b)).

Furthermore, an orientation film is formed on the TFT array and is opposed to a counter substrate having at least an orientation film and a common electrode on its surface, and a liquid crystal is injected therebetween to form an active matrix liquid crystal display, which is not shown. Through the above-mentioned steps, the TFT array and an active matrix liquid crystal display using the TFT array are formed.

Embodiment 2

In EMBODIMENT 1, the uniformity of the thickness in the region B has been enhanced such that the dimensional error of the transmitting/shielding pattern of the photomask is ±0.1 μm or less, desirably 0.05 μm or less. Moreover, in the case in which a plurality of halftone masks are used for one substrate to carry out the exposure, a plurality of photomasks are selected such that a variation in the dimension of the transmitting/shielding pattern is ±0.1 μm or less, desirably 0.05 μm or less. Consequently, even if the exposure is carried out on the same exposure conditions but the amount of the exposure of an exposing machine is varied, a variation in the thickness can be suppressed between a plurality of regions B, the photoresist can be prevented from being partially dissipated and the photoresist removing defects can be prevented from being caused partially.

The present embodiment has an object to suppress a variation in the thickness of the photoresist in the region B by modifying a transmitting/shielding pattern itself.

Figure 14:
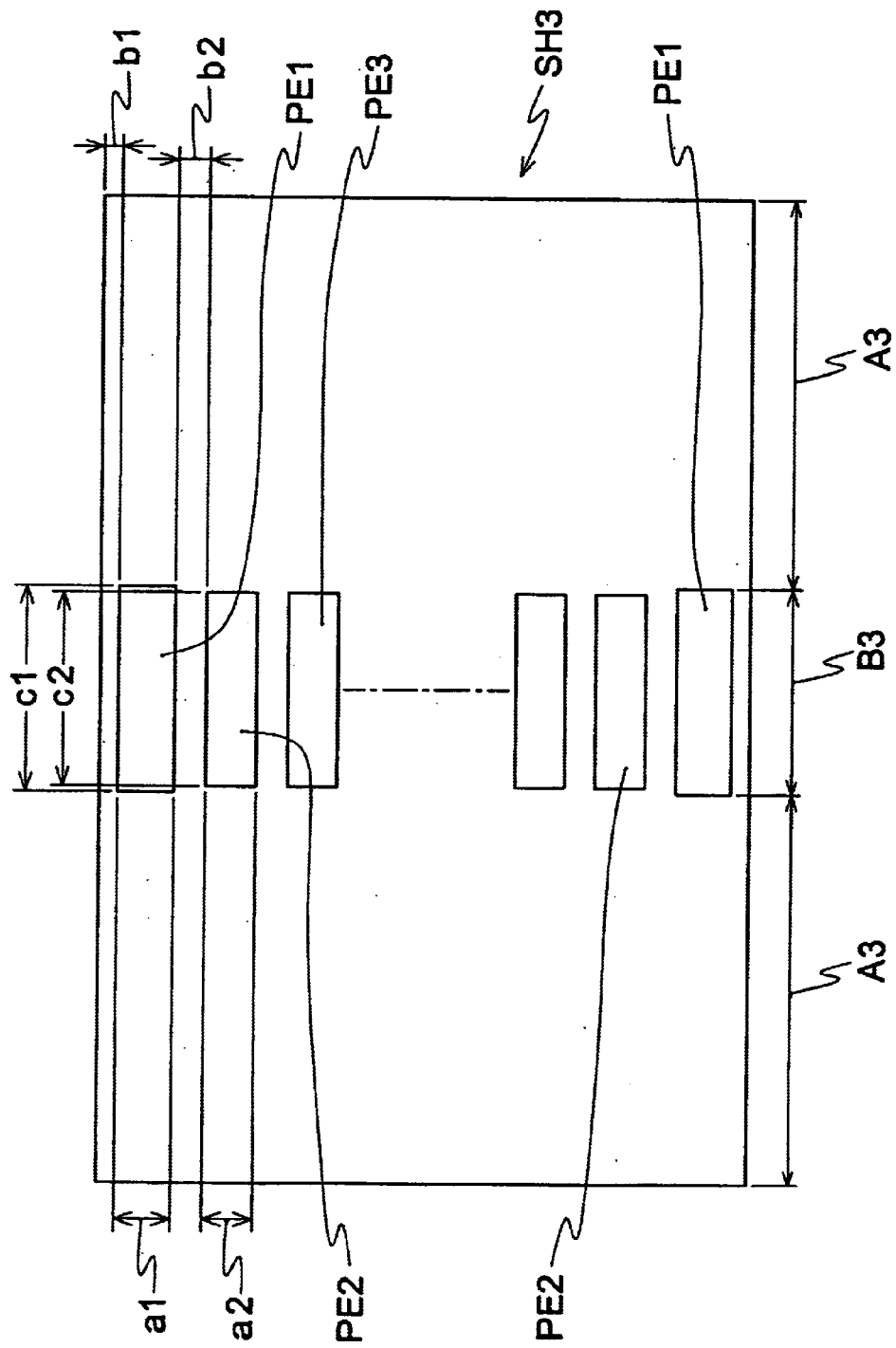
FIG. 14 is a view showing an example of a photomask pattern according to the present embodiment.

FIG. 14 shows a photomask pattern SH3 according to the present embodiment.

The mask pattern SH3 in FIG. 14 has a region A3 for shielding the illuminated light of the exposing machine and a halftone region B3 corresponding to a region B of a photoresist pattern 219, and is similar to the conventional mask pattern SH1 shown in FIG. 6 in that the halftone region B3 is defined by a transmitting/shielding pattern in which a plurality of rectangular transmitting portions and shielding portions are arranged alternately. In the conventional mask pattern SH1, however, there is a problem in that the amount of exposure is particularly insufficient in the vicinity of the end of the region B and the thickness of the photoresist is increased as shown in FIGS. 8 and 9.

In the present embodiment, therefore, the area of a transmitting portion PE1 positioned on both ends in the transmitting portions is set to be larger than the areas of other transmitting portions.

The transmitting portion PE1 on both ends has a length a1 and a width c1 and an adjacent transmitting portion PE2 has a length a2 and a width c2.

If the length a1 of the transmitting portion PE1 and the length a2 of the transmitting portion PE2 have a relationship of a1>a2, the areas of the transmitting portions are set to PE1>PE2 so that the amount of the exposure on both ends in the region B of the photomask pattern can be increased. In particular, if (a2+0.1 μm)<a1<(a2+0.5 μm) is set, a photomask can be formed within a range of manufacturing precision in a photomask pattern and the uniformity of the amount of the exposure in the whole region B can be enhanced. As an example, a1=(a2+0.25 μm) can be set.

Moreover, if the width c1 of the transmitting portion PE1 and the width c2 of the transmitting portion PE2 have a relationship of c1>c2, the areas of the transmitting portions are set to PE1>PE2 so that the amount of the exposure on both ends in the region B can be increased. In particular, if (c2+0.1 μm)<c1<(c2+0.5 μm) is set, a photomask can be formed within a range of manufacturing precision in a photomask pattern and the uniformity of the amount of the exposure in the whole region B can be enhanced. As an example, c1 (c2+0.6 μm) can be set.

Furthermore, a distance b1 between an end side of the photomask pattern and the transmitting portion PE1 and a length b2 of the shielding portion provided between the transmitting portion PE1 and the transmitting portion PE2 are set to b2>b1, the rate of occupation of the transmitting portion in the vicinity of the end of the region B is increased so that the amount of the exposure can be increased. In particular, if (b1+0.1 μm)<b2<(b1+0.5 μm) is set, a photomask can be formed within a range of manufacturing precision in a photomask pattern and the uniformity of the amount of the exposure in the whole region B can be enhanced. As an example, b2=(b1+0.25 μm) can be set.

As described above, the shape of the mask pattern is set such that the rate of the transmitting portion is increased when the end of the region B is closer. Consequently, the amount of the exposure can be increased in the vicinity of the end of the region B so that the uniformity of the amount of the exposure in the whole region B can be enhanced.

Moreover, a photomask pattern for making the amount of the exposure in the region B uniform includes the three patterns described above. By using one of the three patterns, the thickness of the photoresist can be made uniform. By using two or more in combination, the uniformity can be enhanced still more.

By using the photomask, the thickness of the photoresist to be formed can be set to region A>region B>region C and the uniformity of the thickness of the exposed photoresist can be enhanced.

Referring to each region B formed on the same substrate, moreover, the uniformity of the thickness of the photoresist in the region B formed on the same substrate can be enhanced by using a halftone mask in which the dimensions a1, a2, b1, b2, c1 and c2 of the mask pattern are almost equal.

Furthermore, the modification of the transmitting/shielding patterns of the photomasks can also be applied to the formation of an element to be formed by using a TFT for protection against static electricity in addition to the region B of the TFT for each pixel. Similarly, the uniformity of the thickness of the photoresist can be enhanced.

Moreover, the size of each region B of the element and the TFT for each pixel formed in the same substrate is set to be almost equal so that uniformity of photoresist removal in the region B can be enhanced, and the photoresist can be prevented from being dissipated partially and the partial removing defects of the photoresist can be prevented so that yield can be enhanced.

Referring to each region B of the element, the TFT for each pixel and the like formed in the same substrate, furthermore, the uniformity of the thickness of the photoresist in the region B formed in the same substrate can be enhanced by using the halftone mask in which the dimensions a1, a2, b1, b2, c1 and c2 of the mask pattern are almost equal.

Embodiment 3

It is also possible to form a region B by using a halftone mask having a different shape from the shapes according to EMBODIMENT 1 and EMBODIMENT 2.

Figure 7:
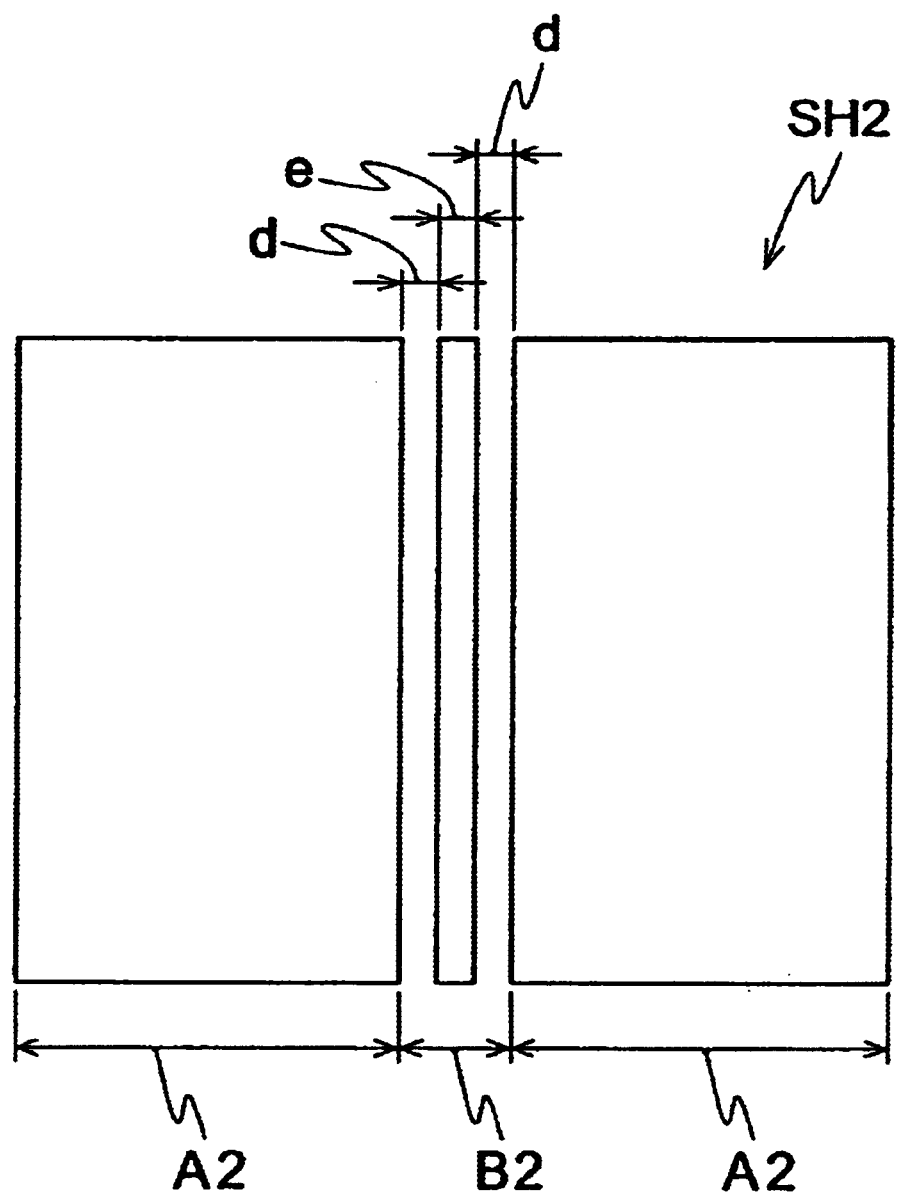
FIG. 7 is a diagram showing another example of the halftone mask pattern.

In the conventional photomask SH2 shown in FIG. 7, a transmitting/shielding pattern for forming the region B has the shape of a stripe in which a transmitting portion having a predetermined width d over the whole length of the photomask and a shielding portion having a predetermined width e over the whole length of the photomask are provided alternately.

In the transmitting/shielding pattern, for the case in which a dimensional error is made on the width d of the transmitting portion, the thickness of a photoresist in the central part of the region B is obtained as shown in FIG. 13. It is assumed that a width (d+e) is constant. In the case in which the dimension of the width d has no error as designed, the thickness of the photoresist in the region B is almost half (0.5) of the thickness in the region A. In the case in which the error of the width d is more than 0.1 μm, the thickness of the photoresist in the region B is 1.0, that is, is equal to that in the region A or the thickness of the photoresist is 0, that is, is equal to that in the region C.

The dimensional error of the conventional photomask for forming a general TFT array is more than ±0.1 μm. Therefore, the thickness of the photoresist in the region B is sometimes 1.0, that is, is equal to that in the region A or the thickness of the photoresist is sometimes 0, that is, is equal to that in the region C due to the dimensional error of the transmitting/shielding pattern. For this reason, yield is deteriorated when forming the region B.

In the present embodiment, it is assumed that at least the dimensional error of the transmitting/shielding pattern of the photomask is equal to or less than ±0.1 μm. Consequently, the photoresist in the region B can be prevented from being dissipated partially. On the contrary, the photoresist can be prevented from being left thickly to increase a time required for removing the photoresist at time of ashing, and the photoresist removing defects can be prevented from being caused partially. Consequently, the yield can be enhanced and tact can be shortened. By setting the dimensional error of the transmitting/shielding pattern to be ±0.05 μm or less, furthermore, the uniformity of the thickness of the photoresist in the region B can be enhanced still more. Also in the case in which the amount of exposure at time of the exposure or the amount of resist removal in the region B at a subsequent step is varied, the partial dissipation and removing defects of the photoresist are not caused so that the yield can be enhanced considerably.

In the case in which a plurality of halftone masks are used for one substrate to carry out the exposure, furthermore, a plurality of photomasks are preferably selected such that a variation in the dimension of a width (d+e) in a pair of adjacent transmitting and shielding portions in the transmitting/shielding pattern of the photomask is 0.1 μm or less, and these photomasks are used to carry out the exposure. Consequently, it is possible to suppress a variation in the thickness in a plurality of regions B, and the photoresist in the region B can be prevented from being dissipated partially. To the contrary, the photoresist removing defects can be prevented from being generated partially. By selecting and using a plurality of photomasks such that a variation in the dimension in the transmitting/shielding pattern is equal to or less than ±0.05 μm, furthermore, it is possible to carry out the exposure with substantially the same exposure conditions for a plurality of exposure regions in consideration of a variation in the amount of the exposure of the exposing machine.

Embodiment 4

In EMBODIMENT 3, the uniformity of the thickness in the region B has been enhanced such that the dimensional error of the transmitting/shielding pattern of the photomask is ±0.1 μm or less, desirably 0.05 μm or less. Moreover, in the case in which a plurality of halftone masks are used for one substrate to carry out the exposure, a plurality of photomasks are selected such that a variation in the dimension of the transmitting/shielding pattern is ±0.1 μm or less, desirably 0.05 μm or less. Consequently, even if the exposure is carried out on the same exposure conditions but the amount of the exposure of an exposing machine is varied, a variation in the thickness can be suppressed between a plurality of regions B, the photoresist can be prevented from being partially dissipated and the photoresist removing defects can be prevented from being generated partially.

The present embodiment has an object to suppress a variation in the thickness of the photoresist in the region B by modifying a transmitting/shielding pattern.

Figure 15:
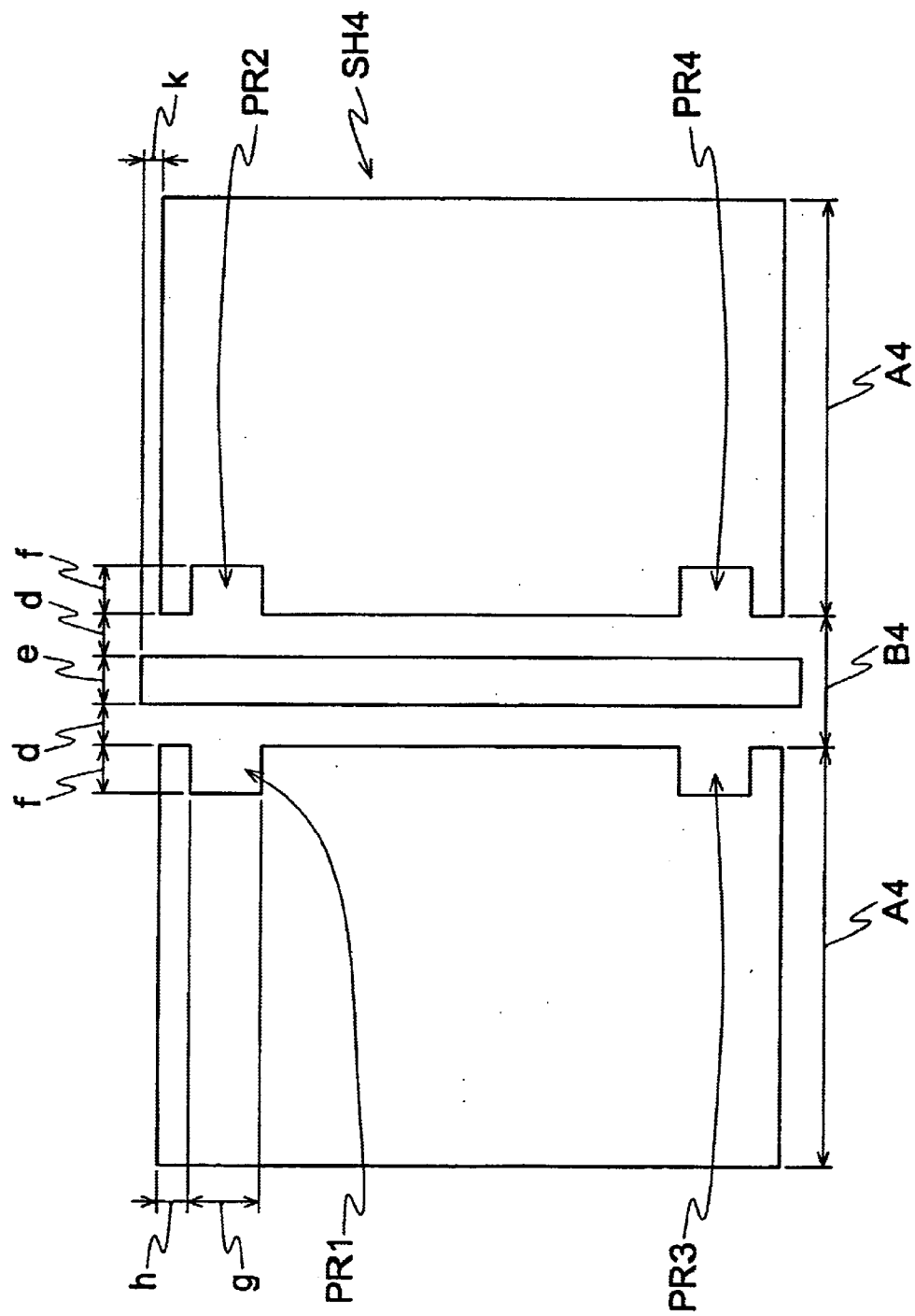
FIG. 15 is a view showing another example of the photomask pattern according to the present embodiment.

FIG. 15 shows a photomask pattern SH4 according to the present embodiment.

The mask pattern SH4 in FIG. 15 is similar to the conventional mask pattern SH2 shown in FIG. 7 in that it has a region A4 for shielding the illuminated light of the exposing machine and a halftone region B4 corresponding to a region B of the photoresist pattern 219 and the halftone region B4 has a stripe-shaped transmitting/shielding pattern in which a transmitting portion having a predetermined width d and a shielding portion having a predetermined width e are alternately provided over the whole length of the photomask. In the conventional mask pattern SH2, however, there is a problem in that the amount of exposure is particularly insufficient in the vicinity of the end of the region B and the thickness of the photoresist is increased as shown in FIGS. 8 and 9.

In the present embodiment, therefore, projections PR1, PR2, PR3 and PR4 are provided as correction patterns on both ends of the stripe-shaped transmitting portion to increase the amount of the exposure in both ends of the region B.

The amount of protrusion of the projections PR1, PR2, PR3 and PR4 from the transmitting portion is represented by f, a width is represented by g, and a distance from each projection to the end of the photomask is represented by h.

At this time, the transmitting/shielding pattern is formed to set d<e, f>0.1 μm, g>0.5 μm and h>0.5 μm. By providing the projections PR1, PR2, PR3 and PR4 on both ends in the stripe-shaped transmitting portion, the amount of exposure on both ends of the region B can be increased. In particular, if (e−0.5 μm)≦d≦((e−0.1 μm), 0.1 μm<f<1.0 μm, g>0.5 μm, and 0.5 μm<h<2.0 μm are set, a photomask can be formed within a range of manufacturing precision in a photomask pattern and the uniformity of the amount of the exposure in the whole region B can be enhanced.

As an example, d=1.1 μm, e=1.4 μm, f=0.3 μm, g=1.8 μm and h=0.9 μm are set.

By causing the length of the stripe-shaped shielding portion to be greater than that of the stripe-shaped transmitting portion and protruding both ends of the stripe-shaped shielding portion from the end of the stripe-shaped transmitting portion by a dimension k, furthermore, it is possible to obtain a more uniform exposure amount distribution. At this time, a photomask pattern is formed within a range of 0.1 μm<k <0.5 μm.

By protruding the shielding portion in addition to the provision of the projections PR1, PR2, PR3 and PR4 in the transmitting portion, the uniformity of the thickness of the photoresist in the region B can be more enhanced. Consequently, the yield of the photoresist removal can be enhanced and the tact of the photoresist removal can be shortened. Moreover, the uniformity of the thickness of the photoresist in the region B can be enhanced. Consequently, the shape of the second conductive film in the region A can be well controlled after the photoresist in the region B is removed, so that the channel length of a TFT can be easily suppressed and quality of display can be enhanced.

Figure 16:
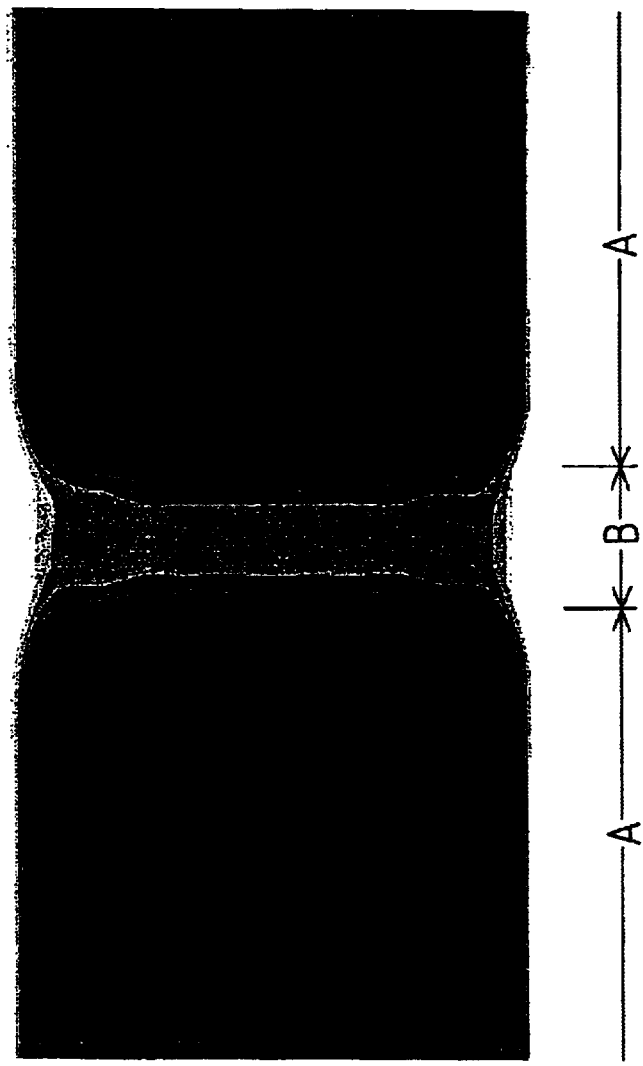
FIG. 16 is a typical view illustrating the distribution of the film thickness of a photoresist pattern in a manufacturing method according to the present invention.
Figure 17:
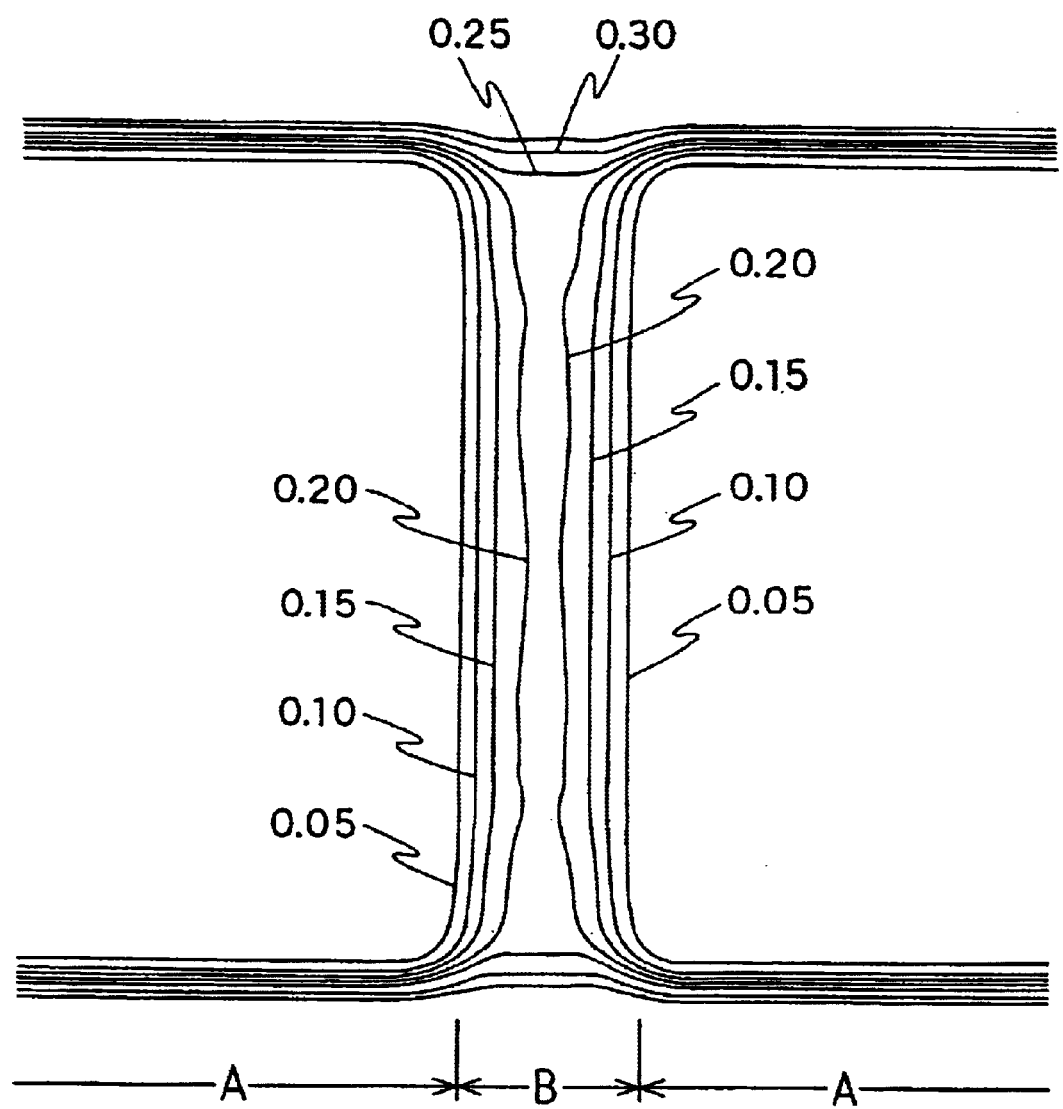
FIG. 17 is a view representing a result obtained by a simulation for the amount of exposure in a TFT array surface in the manufacturing method according to the present invention.

A photoresist pattern formed by using the halftone mask shown in FIG. 15 has such a thickness as shown in an explanatory view of FIG. 16. FIG. 16 shows the thickness of the photoresist in a shade of color, and a dark portion represents a region in which the photoresist has a great thickness and a light portion represents a region in which the photoresist has a small thickness. Moreover, FIG. 17 shows the result obtained by carrying out a simulation using LILE (TRADE NAME; manufactured by Seiko Instruments) for the amount of exposure in the TFT array surface in the case in which the exposure is performed by using the halftone mask in FIG. 15. The result indicates a relative value, wherein the amount of exposure without the halftone mask is set to 1. Moreover, the conditions of the simulation are as follows.

Simulation Condition:
  Exposure wavelength=0.436 μm (g ray)
  Numerical aperture (NA) of projection lens of stepper= 0.1
  Illumination system coherency (σ)=0.5

Figure 8:
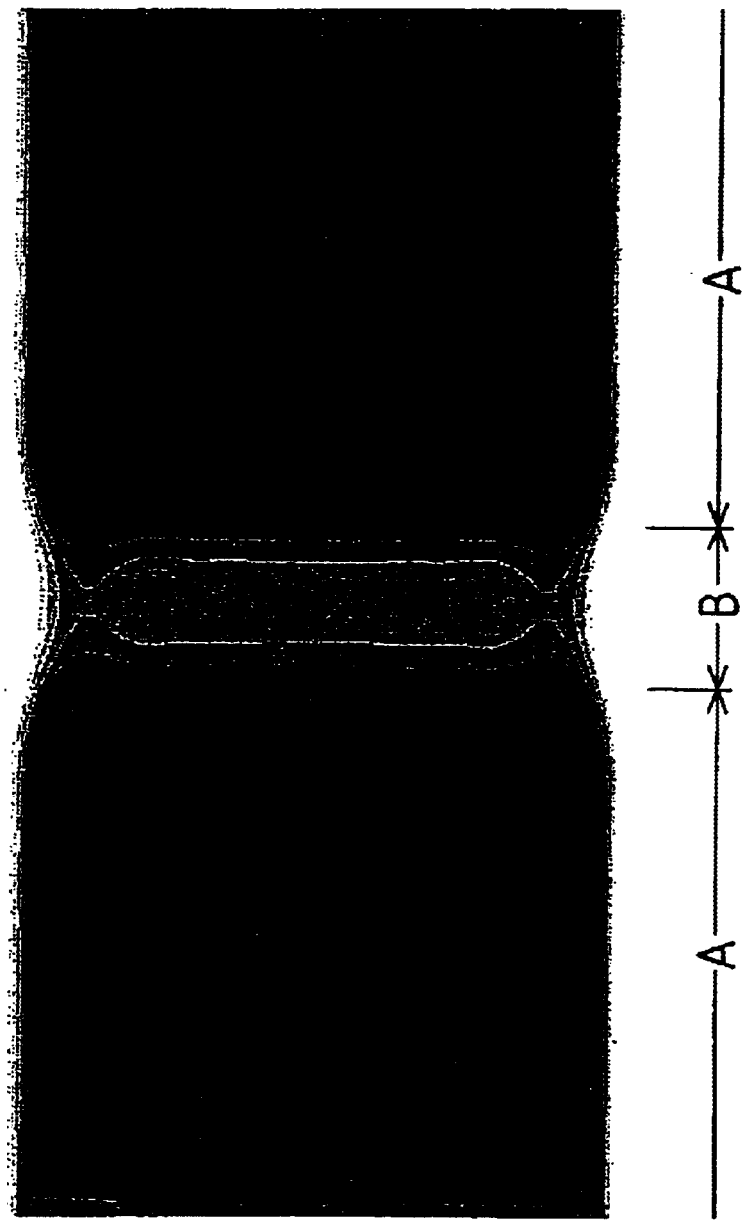
FIG. 8 is a typical view illustrating the distribution of a film thickness of a photoresist.

As compared with the conventional photomask shown in FIGS. 8 and 9, it is apparent that the amount of exposure is uniform on both ends in the region B and the uniformity of the thickness in the region B is enhanced.

Embodiment 5

While a so-called Cs on gate structure in which the storage capacitance 105 is formed between the pixel electrode 214 and the gate line 212 (also serve as the storage capacitance electrode 221) of the adjacent pixel has been described in EMBODIMENT 1 to EMBODIMENT 4, a common storage line structure in which electrode for storage capacitance is formed separately from a gate line may be applicable. The common storage line structure is advantageous since the delay in a gate signal is minimized.

Figure 1:
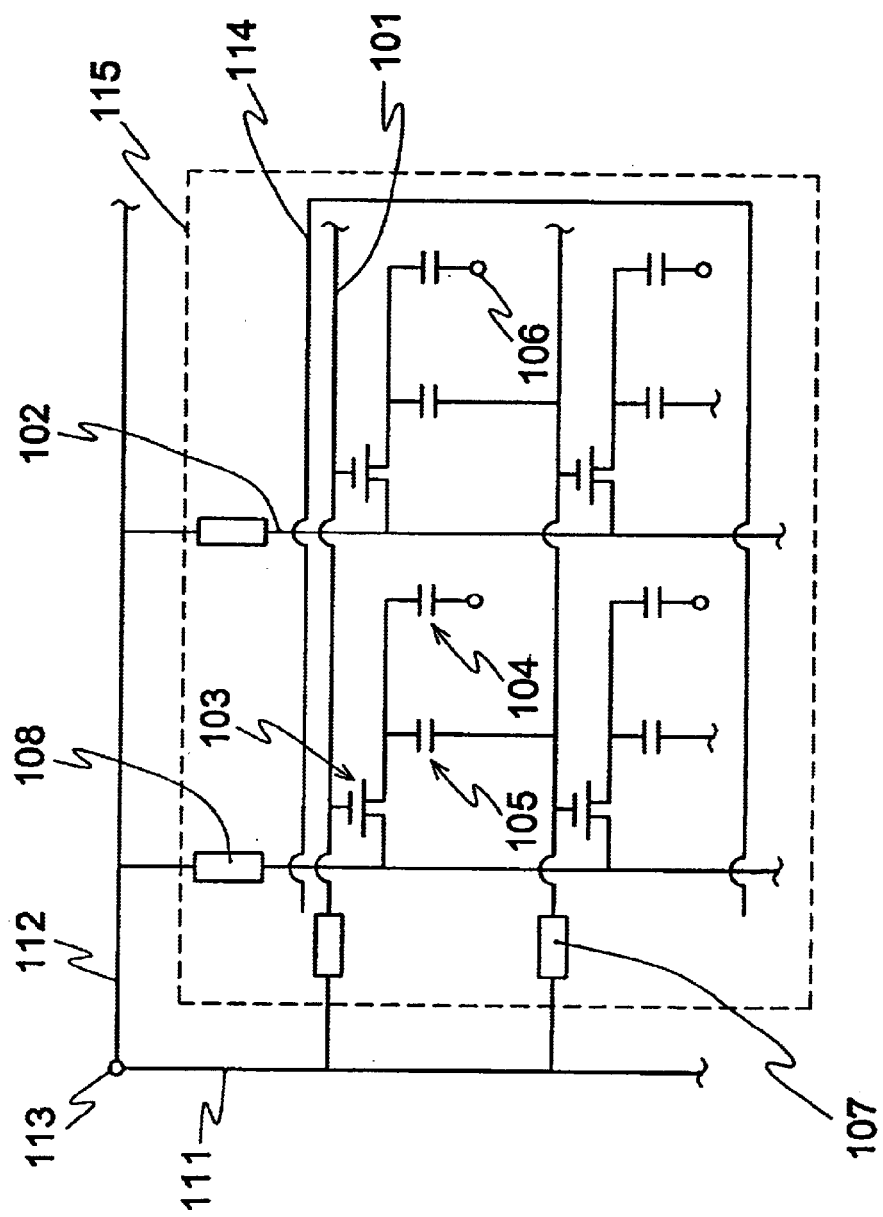
FIG. 1 is a diagram showing an example of the circuit configuration of an active matrix liquid crystal display.
Figure 3A:
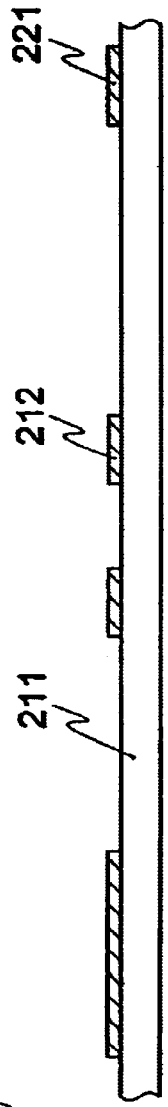
FIG. 3 is a view illustrating a process for manufacturing the TFT array in FIG. 2.
Figure 3B:
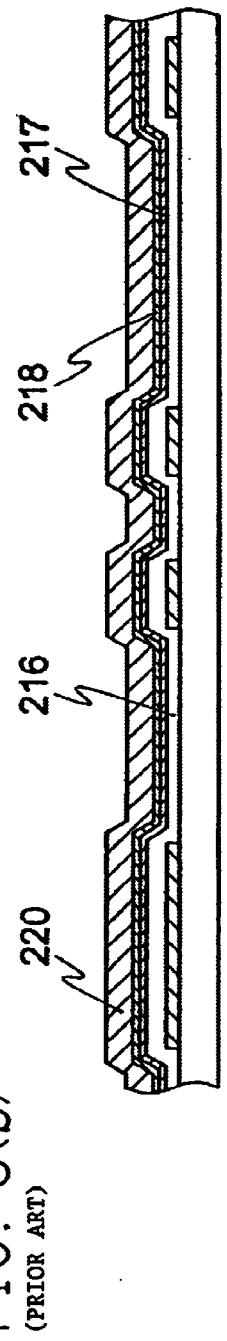
Figure 3C:
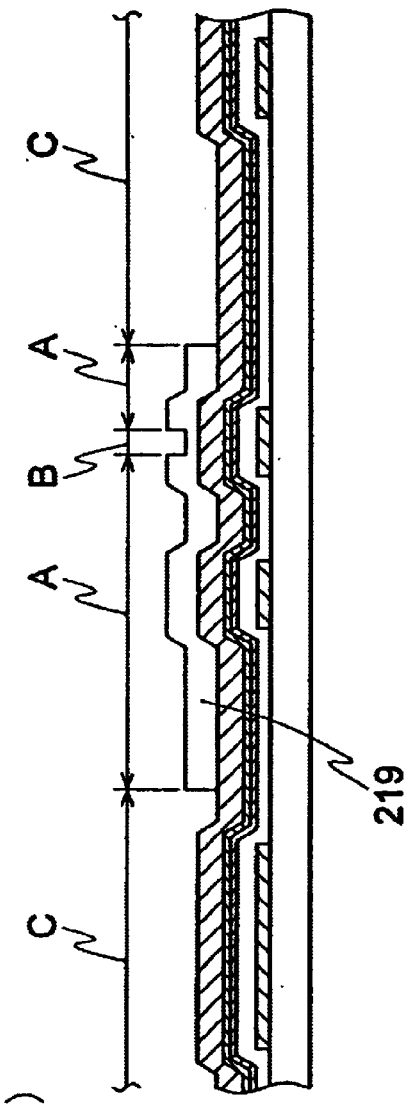
Figure 4A:
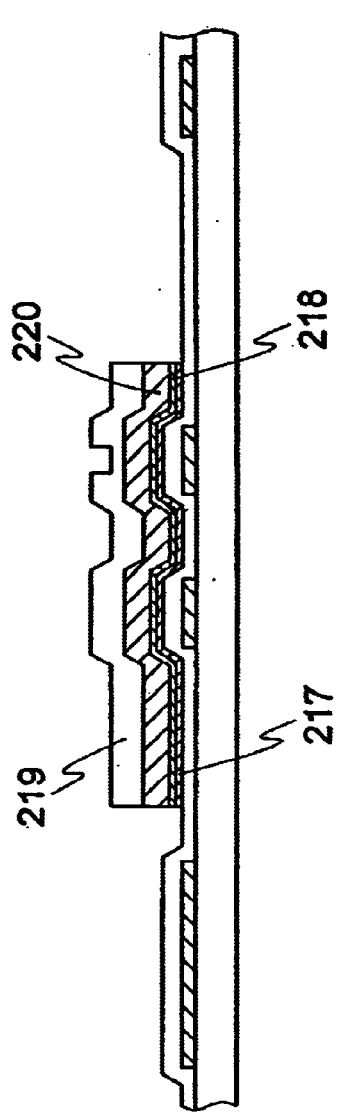
FIG. 4 is a view showing the process for manufacturing the TFT array in FIG. 2, illustrating a succeeding step to FIG. 3.
Figure 4B:
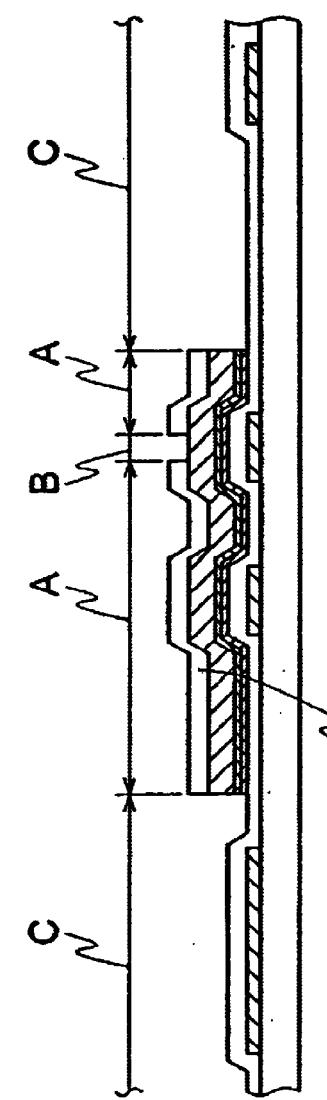
Figure 4C:
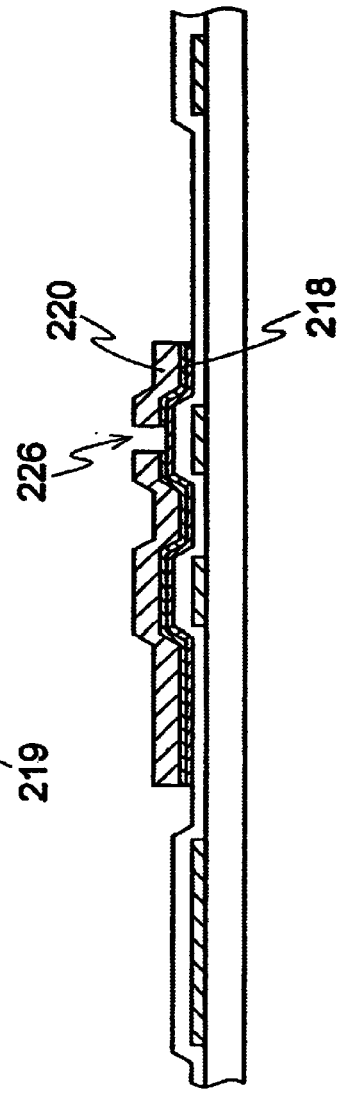
Figure 5A:
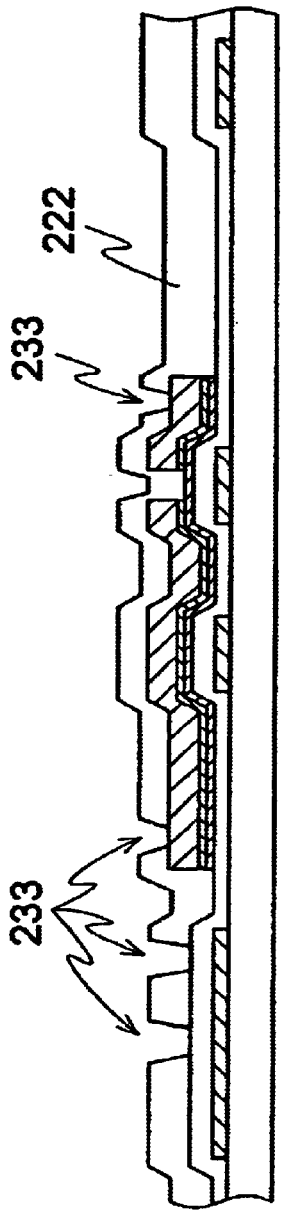
FIG. 5 is a view showing the process for manufacturing the TFT array in FIG. 2, illustrating a succeeding step to FIG. 4.
Figure 5B:
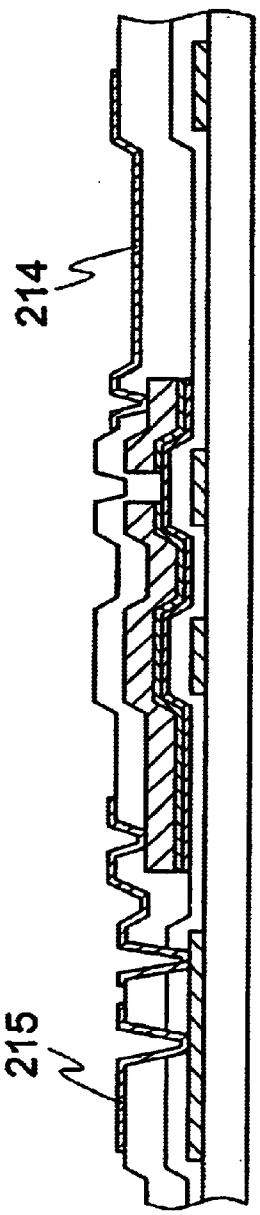
Figure 18:
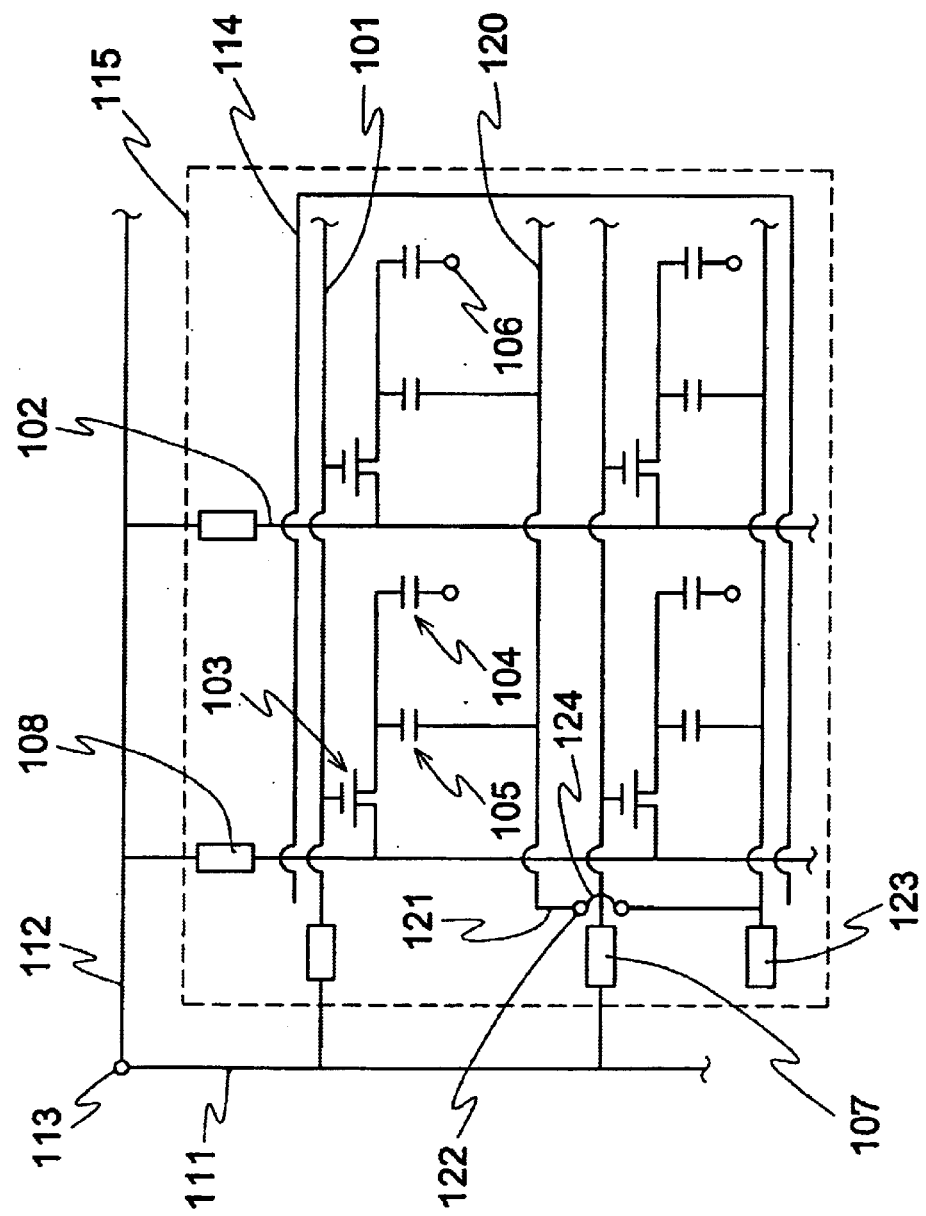
FIG. 18 is a diagram illustrating the structure of a circuit in a liquid crystal display having a common line structure.

A TFT array having the common storage line structure is shown in a circuit diagram of FIG. 18. A storage capacitance 105 is connected to a common line 120. Moreover, each common line 120 is connected to a common line lead 121. A common voltage is applied from the outside through a common line terminal 123 connected to the common line lead. Since the functions of other components and the reference numerals in the drawings are the same as those in FIG. 1, description will be omitted.

Figure 19:
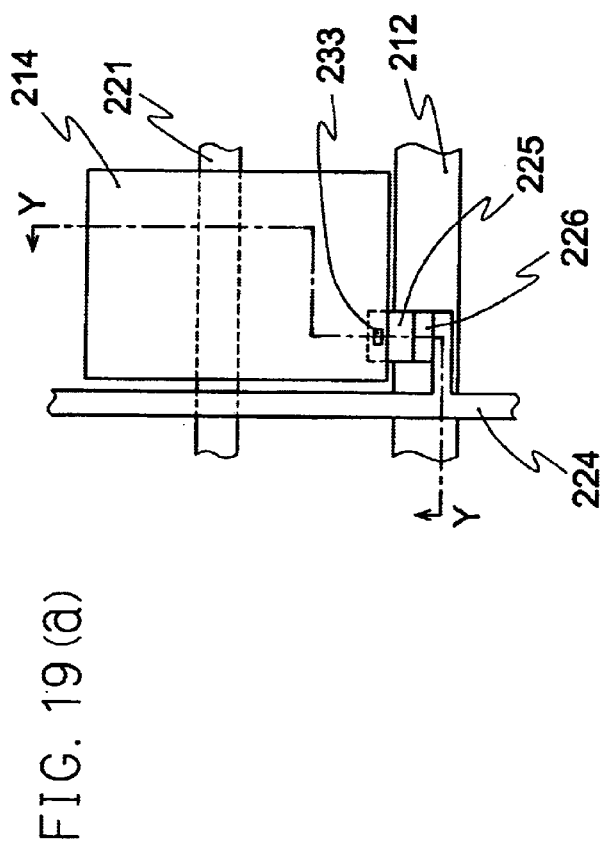
FIG. 19 shows the TFT array of the active matrix liquid crystal display in FIG. 18, FIG. 19(a) being a partially enlarged plan view and FIG. 19(b) being a view showing a Y—Y section in FIG. 19(a)
Figure 19:
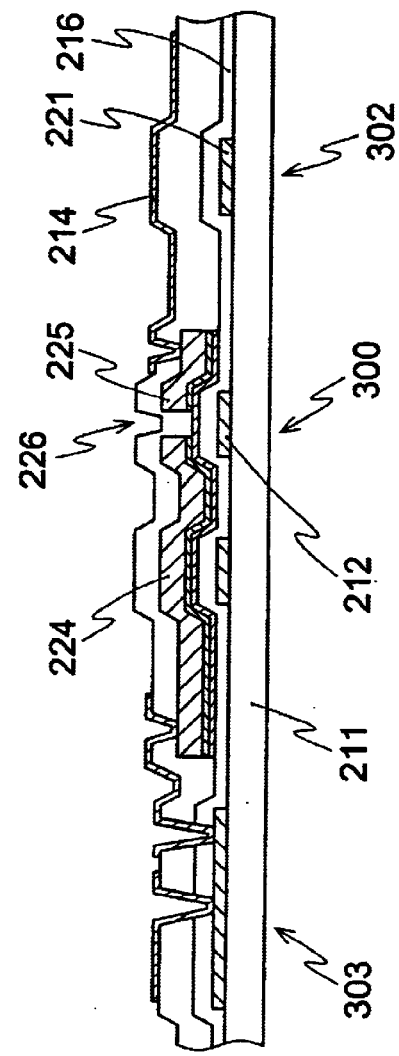

In a liquid crystal display having the common storage line structure shown in FIG. 18, the TFT array has a planar and sectional structure shown in FIG. 19, for example.

In the case in which the common storage line structure is employed as shown in FIGS. 18 and 19, a common line 120 (the storage capacitance electrode 221 in FIG. 19) arranged in parallel with the gate line and a common line lead 121 arranged in perpendicular to the gate line 101 (the gate line 212 in FIG. 19) to connect common lines 120 thereto are required. It is the most preferable that the common line 120 (the storage capacitance electrode 221) should be formed of the same material as the material of the gate line 101 (the gate line 212) at the same time, that is, should be formed of a first conductive film, and the common line lead 121 is formed of the material of a different layer from the gate line 101, for example, a second metal layer which is the same as the source line in at least a portion 124 (see FIG. 18) intersecting the gate line 101. Portions in the common line lead 121 other than the portion intersecting the gate line 101 may be formed of the same material as that of the gate line 101 at the same time, that is, the first conductive film.

Embodiment 6

While the case in which the common electrode for applying a voltage to a liquid crystal is provided on the counter substrate has been described in EMBODIMENT 1 to EMBODIMENT 6, the present invention can be applied to the case in which all electrodes for applying an electric field to a liquid crystal are provided in a TFT array, for example, a liquid crystal display of an In-Plane-switching mode capable of implementing a wide angle of view. In this case, for example, the pixel electrode 214 does not need to be a transparent conductive film but may be metal such as Cr. FIG. 20 is a plan view showing a TFT array according to the present embodiment. The reference numerals in the drawing are the same as those in FIGS. 2 and 19. In the present embodiment, a common electrode 228 is also provided in the TFT array and a liquid crystal is driven by a potential difference between a pixel electrode 214 and a common electrode 228.

Figure 20A:
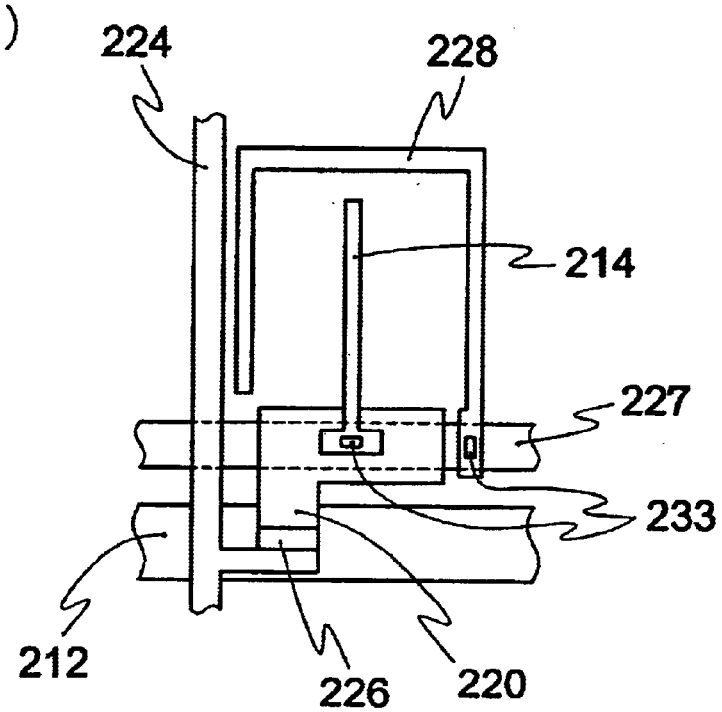
FIG. 20 is a view illustrating a TFT array of a liquid crystal display of In-Plane-switching mode.

In a TFT array shown in FIG. 20(a), a gate line 212 and a common line 227 are formed of the same layer at the step shown in FIG. 10(a) and a source line 224 and a drain electrode 220 are formed of the same layer at the step shown in FIG. 11(c). Then, the pixel electrode 214 and the common electrode 228 are formed of the same layer at the step shown in FIG. 12(b). The pixel electrode 214 and the common electrode 228 are connected to the drain electrode 220 and the common line 227 through a contact hole 233, respectively.

Figure 20B:
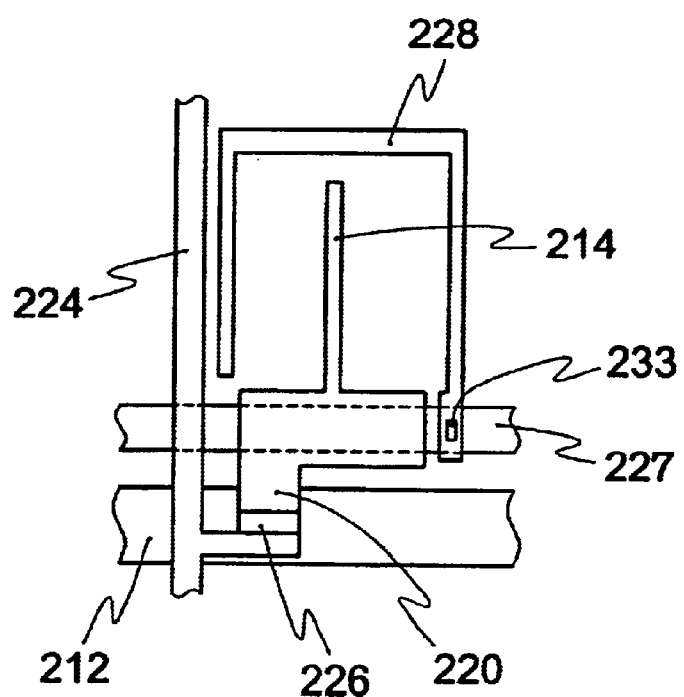

In the TFT array shown in FIG. 20(b), the gate line 212 and the common line 227 are formed of the same layer at the step shown in FIG. 10(a) and the source line 224, the pixel electrode 214 and the common electrode 228 can be then formed of the same layer at the step shown in FIG. 11(c).

Embodiment 7

While the semiconductor layers comprise a–Si in EMBODIMENT 1 to EMBODIMENT 6, Poly –Si is also applicable.

INDUSTRIAL APPLICABILITY

According to the present invention, as described above, dimensional precision in a photomask, particularly, dimensional precision in a transmitting/shielding pattern for carrying out halftone exposure is enhanced and the configuration of the transmitting/shielding pattern is devised in order to control the thickness of a photoresist for forming a TFT channel portion. Consequently, it is possible to enhance the uniformity of the thickness of the photoresist and the reproducibility in film thickness formation, and yield can be enhanced and a cost can be reduced. Moreover, since variation in the channel length of a TFT can be suppressed, an enhancement in quality of display can be implemented.

What is claimed is:

1. A method of manufacturing a TFT array comprising the following steps of:
    applying photoresist onto a film to be etched,
    forming a photoresist pattern of desired pattern by exposing and developing the photoresist using a photomask,
    etching the film using the photoresist pattern,
    removing a part of the photoresist pattern, and
    etching the film using the partly removed photoresist pattern,
    wherein the photomask comprises;
    a region A* in which illuminated light from an exposing machine during the exposure step is shade to limit the amount of illuminated light transmitting therethrough in order to leave the resist pattern through the step for partly removing the photoresist pattern,
    a region C* in which illuminated light from the exposing machine during the exposure step is transmitted to allow the sufficient amount of illuminated light transmitting therethrough in order to remove the photoresist through the step of developing, and
    a region B* in which a transmitting/shielding pattern having finer dimensions than resolution of the exposing machine is provided, so that the amount of light transmitting therethrough during the exposure step is intermediate between those in the region A* and C*, and
    wherein the transmitting/shielding pattern has a ladder-like shape in which at least three rectangular transmitting portion, each of which has a predetermined length and width, are arranged in a lengthwise direction thereof, and a dimensional precision of the transmitting pattern is ±0.1 µm at maximum.

2. A method of manufacturing a TFT array according to claim 1, wherein the dimensional precision of the transmitting pattern is ±0.05 µm at maximum.

3. A method of manufacturing a TFT array comprising the following steps of:
    applying photoresist onto a film to be etched,
    forming a photoresist pattern of desired pattern by exposing and developing the photoresist using a photomask,
    etching the film using the photoresist pattern,
    removing a part of the photoresist pattern, and
    etching the film using the partly removed photoresist pattern,
    wherein the photomask comprises;
    a region A* in which illuminated light from an exposing machine during the exposure step is shade to limit the amount of illuminated light transmitting therethrough in order to leave the resist pattern through the step for partly removing the photoresist pattern,
    a region C* in which illuminated light from the exposing machine during the exposure step is transmitted to allow the sufficient amount of illuminated light transmitting therethrough in order to remove the photoresist through the step of developing, and
    a region B* in which a transmitting/shielding pattern having finer dimensions than resolution of the exposing machine is provided, so that the amount of light transmitting therethrough during the exposure step is intermediate between those in the region A* and C*, and
    wherein the transmitting/shielding pattern has a ladder-like shape in which at least three rectangular transmitting portion, each of which has a predetermined length and width, are arranged in a lengthwise direction thereof, and an area of the transmitting portion arranged at the end of the transmitting/shielding pattern is larger than that of the other transmitting portion.

4. A method of manufacturing a TFT array according to claim 1, 2 or 3, wherein a length of the transmitting portion arranged at the end of the transmitting/shielding pattern is larger than that of the other transmitting portion.

5. A method of manufacturing a TFT array according to claim 1, 2 or 3, wherein a length of the transmitting portion arranged at the end of the transmitting/shielding pattern is 0.1 to 0.5 µm larger than that of the other transmitting portion.

6. A method of manufacturing a TFT array according to claim 1, 2 or 3, wherein a distance between the end of the transmitting/shielding pattern and the transmitting portion arranged at the end of the transmitting/shielding pattern is smaller than that between the transmitting portion arranged at the end of the transmitting/shielding pattern and a transmitting portion adjacent to the transmitting portion arranged at the ends of the transmitting/shielding pattern.

7. A method of manufacturing a TFT array according to claim 1, 2 or 3, wherein a distance between the end of the transmitting/shielding pattern and the transmitting portion arranged at the end of the transmitting/shielding pattern is 0.1 to 0.5 µm smaller than that between the transmitting portion arranged at the end of the transmitting/shielding pattern and a transmitting portion adjacent to the transmitting portion arranged at the ends of the transmitting/shielding pattern.

8. A method of manufacturing a TFT array according to claim 1, 2 or 3, wherein a width of the transmitting portion arranged at the end of the transmitting/shielding pattern is larger than that of the other transmitting portion.

9. A method of manufacturing a TFT array according to claim 1, 2 or 3, wherein a width of the transmitting portion arranged at the end of the transmitting/shielding pattern is 0.1 to 0.5 µm larger than that of the other transmitting portion.

10. A method of manufacturing a TFT array comprising the following steps of:

applying photoresist onto a film to be etched, forming a photoresist pattern of desired pattern by exposing and developing the photoresist using a photomask, etching the film using the photoresist pattern, removing a part of the photoresist pattern, and etching the film using the partly removed photoresist pattern, wherein the photomask comprises;

a region A* in which illuminated light from an exposing machine during the exposure step is shade to limit the amount of illuminated light transmitting therethrough in order to leave the resist pattern through the step for partly removing the photoresist pattern, a region C* in which illuminated light from the exposing machine during the exposure step is transmitted to allow the sufficient amount of illuminated light transmitting therethrough in order to remove the photoresist through the step of developing, and a region B* in which a transmitting/shielding pattern having finer dimensions than resolution of the exposing machine is provided, so that the amount of light transmitting therethrough during the exposure step is intermediate between those in the region A* and C*, and wherein the transmitting/shielding pattern has a stripes-like shape in which a transmitting portion and a shielding portion, having a predetermined width d and e over the length of the photomask respectively, are alternately arranged, and a dimensional precision of the transmitting portion is ±0.1 µm at maximum.

11. A method of manufacturing a TFT array according to claim 10, wherein the dimensional precision of the transmitting pattern is ±0.05 µm at maximum.

12. A method of manufacturing a TFT array comprising the following steps of:

applying photoresist onto a film to be etched, forming a photoresist pattern of desired pattern by exposing and developing the photoresist using a photomask, etching the film using the photoresist pattern, removing a part of the photoresist pattern, and etching the film using the partly removed photoresist pattern, wherein the photomask comprises;

a region A* in which illuminated light from an exposing machine during the exposure step is shade to limit the amount of illuminated light transmitting therethrough in order to leave the resist pattern through the step for partly removing the photoresist pattern, a region C* in which illuminated light from the exposing machine during the exposure step is transmitted to allow the sufficient amount of illuminated light transmitting therethrough in order to remove the photoresist through the step of developing, and a region B* in which a transmitting/shielding pattern having finer dimensions than resolution of the exposing machine is provided, so that the amount of light transmitting therethrough during the exposure step is intermediate between those in the region A* and C*, and wherein the transmitting/shielding pattern has a stripes-like shape in which a transmitting portion and a shielding portion, having a predetermined width d and e over the length of the photomask respectively, are alternately arranged, and a projection is provided by the end of the transmitting portion to enlarge the transmitting portion by the end.

13. A method of manufacturing a TFT array according to claim 12, wherein the projection squarely protrudes from the transmitting portion by 0.1 to 0.5 µm.

14. A method of manufacturing a TFT array according to claim 12, wherein the projection has a width of 0.5 to 2 µm and squarely protrudes from the transmitting portion by 0.1 to 0.5 µm.

15. A method of manufacturing a TFT array according to claim 14, wherein the projection is formed at a position within 1 to 3 µm from the end of the transmitting portion.

16. A method of manufacturing a TFT array according to claim 15, wherein the shielding portion is longer than the transmitting portion so that the end of the shielding portion protrudes from the end of the transmitting portion.

17. A method of manufacturing a TFT array according to claim 15, wherein the shielding portion is longer than the transmitting portion and the end of the shielding portion protrudes from the end of the transmitting portion by 0.1 to 0.5 µm.

18. A method of manufacturing a TFT array according to claim 1 or 3 or 10 or 12, wherein the photoresist pattern is formed using a plurality of photomasks and variation in dimension of the transmitting/shielding pattern among the plurality of photomasks is ±0.1 µm at maximum.

19. A method of manufacturing a TFT array according to claim 1 or 3 or 10 or 12, wherein the photoresist pattern is formed using a plurality of photomasks and variation in dimension of the transmitting/shielding pattern among the plurality of photomasks is ±0.05 µm at maximum.

20. A method of manufacturing a TFT array according to claim 1 or 3 or 10 or 12, wherein the photoresist is exposed by the exposure step using a plurality of photomasks, and wherein a region A, in which the photoresist has a great thickness to form a source and drain electrode of a TFT, is formed by the region A* of the photomask, a region B, in which the photoresist has a small thickness to form a channel of the TFT, is formed by the region B* of the photomask, and a region C, in which the photoresist is removed to form a pixel electrode, is formed by the region C* of the photomask.

21. A method of manufacturing a TFT array according to claim 1 or 3 or 10 or 12, comprising the steps of:

forming a gate line on a substrate, forming an insulating film covering the gate line, forming a semiconductor layer on the insulating film, forming a metal layer on the semiconductor layer, applying photoresist on the metal layer, forming a region A in which the photoresist remains having great thickness, a region B in which the photoresist remains having small thickness, and a region C in which photoresist is removed, by exposing the photoresist to light from an exposing machine, applying the photomask, and developing the exposed photoresist, etching the metal layer and semiconductor layer in the region C, removing the photoresist in the region B, leaving the photoresist in the region A, and etching the metal layer and a part of the semiconductor layer in the region B, wherein at least a source electrode and a drain electrode of a TFT are formed in the region A, and a channel of the TFT is formed in the region B.

* * * * *

UNITED STATES PATENT AND TRADEMARK OFFICE
CERTIFICATE OF CORRECTION

PATENT NO. : 6,884,569 B2
DATED : April 26, 2005
INVENTOR(S) : Ken Nakashima and Kazuhiro Kobayashi It is certified that error appears in the above-identified patent and that said Letters Patent is hereby corrected as shown below:

Column 5,
Line 12, after "regions.", "dr" should be deleted.

Column 6,
Line 43, after "drawing)", -- . -- should be inserted.

Column 8,
Line 9, "e" should be -- c --.

Column 11,
Line 10, after "cl" -- = -- should be inserted.

Column 17,
Line 61, "d and e" should be -- $\underline{d}$ and $\underline{e}$ --.

Column 18,
Line 28, "d and e" should be -- $\underline{d}$ and $\underline{e}$ --.

Signed and Sealed this

Ninth Day of August, 2005

JON W. DUDAS
*Director of the United States Patent and Trademark Office*

UNITED STATES PATENT AND TRADEMARK OFFICE
CERTIFICATE OF CORRECTION

PATENT NO. : 6,884,569 B2
DATED : April 26, 2005
INVENTOR(S) : Ken Nakashima and Kazuhiro Kobayashi It is certified that error appears in the above-identified patent and that said Letters Patent is hereby corrected as shown below:

Column 1,
Line 7, after "2001" insert -- , which claims benefit to Japanese application serial no. 2000-241264, filed August 9, 2000. --.

Signed and Sealed this

Eighth Day of November, 2005

JON W. DUDAS
*Director of the United States Patent and Trademark Office*

UNITED STATES PATENT AND TRADEMARK OFFICE
CERTIFICATE OF CORRECTION

PATENT NO. : 6,884,569 B2
DATED : April 26, 2005
INVENTOR(S) : Ken Nakashima and Kazuhiro Kobayashi It is certified that error appears in the above-identified patent and that said Letters Patent is hereby corrected as shown below:

Column 13,
Line 44, "g>" should be -- g≥ --.

Signed and Sealed this

Seventh Day of February, 2006

JON W. DUDAS
*Director of the United States Patent and Trademark Office*

UNITED STATES PATENT AND TRADEMARK OFFICE
CERTIFICATE OF CORRECTION

PATENT NO.     : 6,884,569 B2
DATED          : April 26, 2005
INVENTOR(S)    : Ken Nakashima and Kazuhiro Kobayashi It is certified that error appears in the above-identified patent and that said Letters Patent is hereby corrected as shown below:

<u>Column 13,</u>
Line 44, "g>" should be -- g≥ --.

Signed and Sealed this

Twenty-first Day of March, 2006

JON W. DUDAS
*Director of the United States Patent and Trademark Office*